United States Patent
Koleti et al.

(10) Patent No.: US 12,265,712 B2
(45) Date of Patent: Apr. 1, 2025

(54) DYNAMIC DDR SCALING AND USE CASE MANAGEMENT BASED ON DDR REFRESH RATE AND SIZE

(71) Applicant: QUALCOMM Incorporated, San Diego, CA (US)

(72) Inventors: Prasad Rao Koleti, Hyderabad (IN); Pranav Agrawal, Hyderabad (IN); Vipan Kumar Bindal, Bangalore (IN); Shriharsha Chebbi, Hyderabad (IN); Ankith Agarwal, Hyderabad (IN); Raja Simha Revanuru, Hyderabad (IN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 18/447,159

(22) Filed: Aug. 9, 2023

(65) Prior Publication Data
US 2025/0053310 A1    Feb. 13, 2025

(51) Int. Cl.
*G06F 3/06* (2006.01)

(52) U.S. Cl.
CPC .......... *G06F 3/0619* (2013.01); *G06F 3/0653* (2013.01); *G06F 3/0673* (2013.01)

(58) Field of Classification Search
CPC ..... G06F 3/0619; G06F 3/0653; G06F 3/0673
See application file for complete search history.

(56) References Cited

U.S. PATENT DOCUMENTS

| | | | |
|---|---|---|---|
| 2008/0320267 A1 | 12/2008 | Bilger et al. | |
| 2011/0314306 A1* | 12/2011 | Lin | G06F 1/324 713/300 |
| 2012/0198266 A1* | 8/2012 | Hofmann | G06F 13/4022 710/110 |
| 2015/0006924 A1* | 1/2015 | Jain | G06F 3/0625 713/320 |
| 2015/0378424 A1* | 12/2015 | Anyuru | G06F 1/3296 713/320 |
| 2017/0083262 A1* | 3/2017 | Gadelrab | G06F 1/324 |
| 2017/0277460 A1* | 9/2017 | Li | G06F 1/3275 |

(Continued)

OTHER PUBLICATIONS

International Search Report and Written Opinion—PCT/US2024/031884—ISA/EPO—Sep. 11, 2024.

*Primary Examiner* — Ryan Bertram
(74) *Attorney, Agent, or Firm* — Muncy, Geissler, Olds & Lowe, P.C./QUALCOMM

(57) ABSTRACT

Various embodiments include methods and devices for implementing scaling memory frequency configuration by a computing device. Embodiments may include comparing at least a memory refresh rate, a memory size, at least one use case bandwidth of transmission between the memory and a system on chip (SoC), and a use case latency of transmission between the memory and the SoC with at least one stored memory refresh rate, at least one stored memory size, at least one stored use case bandwidth of transmission between the memory and the SoC, and at least one stored use case latency of transmission between the memory and the SoC, selecting a memory frequency based on a result of the comparison, and configuring the memory for the memory frequency. Some embodiments may include issuing an alarm indicating changing the use for the memory to be able to achieve a use case parameter.

28 Claims, 11 Drawing Sheets

400

| Use Case | Use Case Current Bandwidth | Use Case Average Bandwidth | Use Case Latency | Memory Refresh Rate | Memory Size | Memory Frequency |
|---|---|---|---|---|---|---|
| Use case 1 | Use case CBW 1 | Use case ABW 1 | Use case latency 1 | Memory Refresh Rate 1 | Memory size 1 | Memory frequency 1 |
| • • • | | | | | | |
| Use case M-N | Use case CBW N | Use case ABW P | Use case latency Q | Memory Refresh Rate R | Memory size 1 | Memory frequency S |
| • • • | | | | | | |
| Use case M | Use case CBW U | Use case ABW V | Use case latency W | Memory Refresh Rate X | Memory size Y | Memory frequency Z |

(56) References Cited

U.S. PATENT DOCUMENTS

| | | | |
|---|---|---|---|
| 2017/0285682 A1* | 10/2017 | Huang | G06F 1/08 |
| 2017/0315747 A1* | 11/2017 | Yang | G06F 3/0634 |
| 2018/0373314 A1* | 12/2018 | Stewart | G06F 1/3296 |
| 2019/0026028 A1* | 1/2019 | Chun | G11C 11/40626 |
| 2019/0214075 A1* | 7/2019 | Chen | G06F 3/0673 |
| 2022/0300049 A1 | 9/2022 | Dahiya et al. | |
| 2023/0137769 A1* | 5/2023 | Mathiyalagan | G06F 1/324 |
| | | | 718/104 |

* cited by examiner

| Use Case | Use Case Current Bandwidth | Use Case Average Bandwidth | Use Case Latency | Memory Refresh Rate | Memory Size | Memory Frequency |
|---|---|---|---|---|---|---|
| Use case 1 | Use case CBW 1 | Use case ABW 1 | Use case latency 1 | Memory Refresh Rate 1 | Memory size 1 | Memory frequency 1 |
| Use case M-N | Use case CBW N | Use case ABW P | Use case latency Q | Memory Refresh Rate R | Memory size 1 | Memory frequency S |
| Use case M | Use case CBW U | Use case ABW V | Use case latency W | Memory Refresh Rate X | Memory size Y | Memory frequency Z |

DYNAMIC DDR SCALING AND USE CASE MANAGEMENT BASED ON DDR REFRESH RATE AND SIZE

BACKGROUND

Memory usage requirements for a use case can be stringent. The use case can require certain parameters to be met for proper function of the use case. For example, the use case can require levels of bandwidth and latency for using a double data rate (DDR) random access memory (RAM). The ability of the memory to achieve the parameters can be affected by temperature of the memory. For example, DDR memory has to increase a memory refresh rate when temperature at the DDR memory increases to maintain integrity of data stored at the DDR memory. Increasing the memory refresh rate reduces bandwidth and increases latency for the DDR memory. The increase of the memory refresh rate, and the effects on bandwidth and latency, can result in failure to meet the use case requirements.

SUMMARY

Various aspects provide methods include methods and apparatuses for implementing such methods for scaling memory frequency configuration of a memory of a computing device. Aspects may include comparing at least a memory refresh rate, a memory size, at least one use case bandwidth of transmission between the memory and a system on chip (SoC), and a use case latency of transmission between the memory and the SoC with at least one stored memory refresh rate, at least one stored memory size, at least one stored use case bandwidth of transmission between the memory and the SoC, and at least one stored use case latency of transmission between the memory and the SoC, selecting a memory frequency based on a result of the comparison, and configuring the memory for the memory frequency.

In some aspects, the at least one use case bandwidth may include a use case current bandwidth and a use case average bandwidth, and the at least one stored use case bandwidth may include a stored use case current bandwidth and a stored use case average bandwidth.

Some aspects may further include identifying a stored memory refresh rate matching the memory refresh rate, identifying a stored memory size matching the memory size, identifying the at least one stored use case bandwidth matching the at least one use case bandwidth, identifying the at least one stored use case latency matching the use case latency, in which the result of the comparison may include the stored memory refresh rate, the stored memory size, the at least one stored use case bandwidth, and the at least one stored use case latency, and identifying the memory frequency stored in association with the stored memory refresh rate, the stored memory size, the at least one stored use case bandwidth, and the at least one stored use case latency.

Some aspects may further include identifying a maximum memory frequency as the memory frequency in response to failing to identify at least one of the at least one stored use case bandwidth matching the at least one use case bandwidth or the at least one stored use case latency matching the use case latency, in which the result of the comparison may include less than all of the at least one stored use case bandwidth matching the use case bandwidth or the at least one stored use case latency matching the use case latency.

Some aspects may further include issuing an alarm signal configured to indicate changing the use case for the memory to be able to achieve a use case parameter.

Some aspects may further include receiving the memory refresh rate from a memory subsystem.

Some aspects may further include transmitting a memory frequency modification signal to a memory subsystem.

Further aspects include a computing device including a memory and a processor and/or memory frequency device configured to perform operations of any of the methods summarized above. Further aspects include a non-transitory processor-readable storage medium having stored thereon processor-executable software instructions configured to cause a processor and/or memory frequency device to perform operations of any of the methods summarized above. Further aspects include a computing device having means for accomplishing functions of any of the methods summarized above.

BRIEF DESCRIPTION OF THE DRAWINGS

The accompanying drawings, which are incorporated herein and constitute part of this specification, illustrate example embodiments of various embodiments, and together with the general description given above and the detailed description given below, serve to explain the features of the claims.

FIG. 4 is an information structure diagram illustrating an example information structure for implementing dynamic DDR scaling and use case management based on DDR refresh rate and size according to an embodiment.

DETAILED DESCRIPTION

Figure 1:
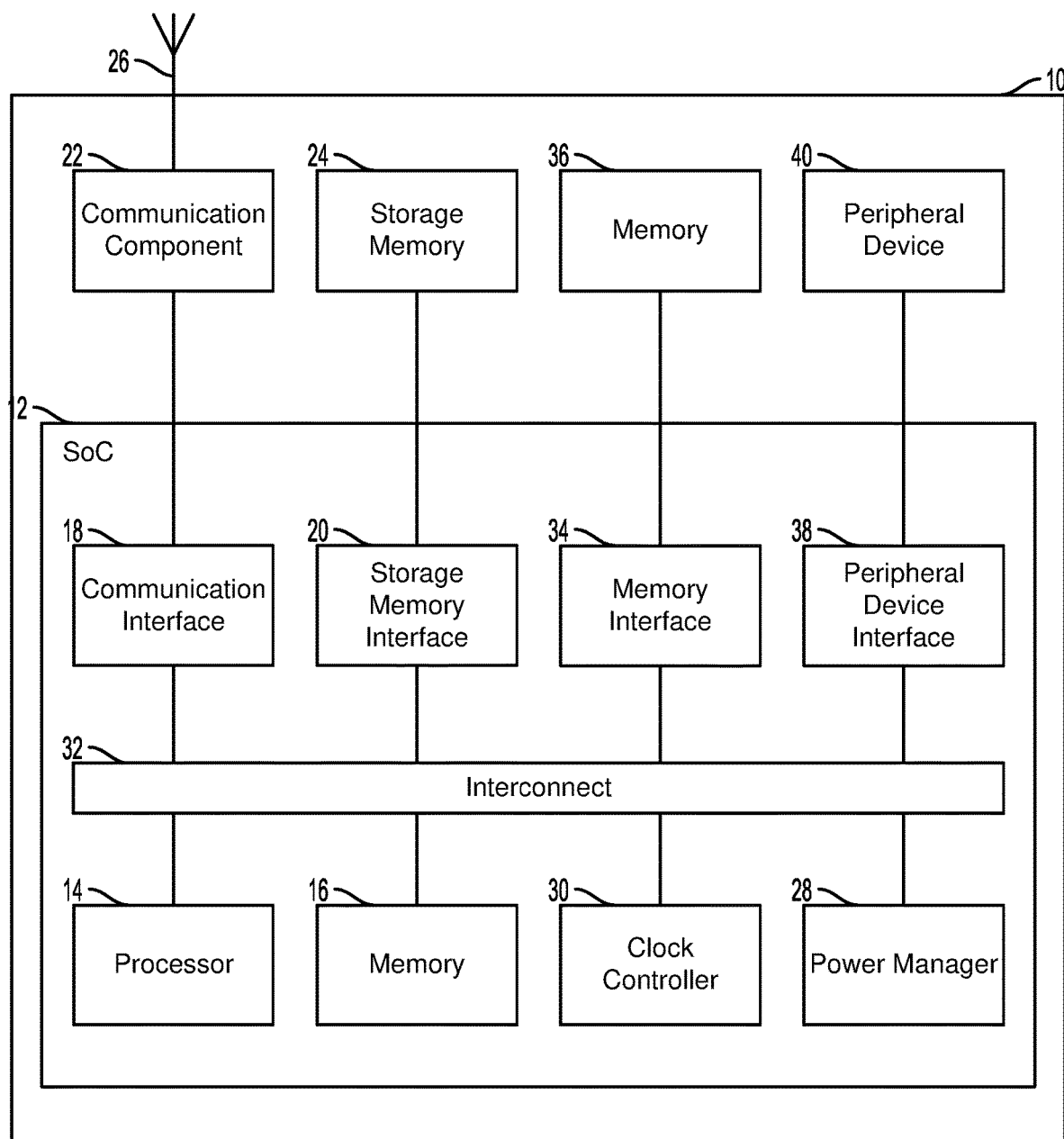
FIG. 1 is a component block diagram illustrating an example computing device suitable for implementing various embodiments.

Various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the claims.

Various embodiments include methods, and computing devices implementing such methods of implementing dynamic DDR scaling and use case management based on DDR refresh rate and size. Various embodiments may include comparing memory characteristics and use case parameters with stored data, selecting a memory frequency based on a result of the comparison, and configuring the memory for the memory frequency. Some embodiments may include identifying the memory frequency based on the memory characteristics being able to achieve the use case parameters. Some embodiments may include identifying a maximum memory frequency as the memory frequency based on the memory characteristics being unable to achieve the use case parameters. Some embodiments may include issuing an alarm signal configured to indicate changing the use case for the memory to be able to achieve use case parameters based on the memory characteristics being unable to achieve the use case parameters.

The term "computing device" is used herein to refer to stationary computing devices including personal computers, desktop computers, all-in-one computers, workstations, super computers, mainframe computers, embedded computers (such as in vehicles and other larger systems), computing systems within or configured for use in vehicles, servers, multimedia computers, and game consoles. The terms "computing device" and "mobile computing device" are used interchangeably herein to refer to any one or all of cellular telephones, smartphones, personal or mobile multi-media players, personal data assistants (PDA's), laptop computers, tablet computers, convertible laptops/tablets (2-in-1 computers), smartbooks, ultrabooks, netbooks, palm-top computers, wireless electronic mail receivers, multimedia Internet enabled cellular telephones, mobile gaming consoles, wireless gaming controllers, and similar personal electronic devices that include a memory, and a programmable processor.

Various embodiments are described in terms of code, e.g., processor-executable instructions, for ease and clarity of explanation, but may be similarly applicable to any data, e.g., code, program data, or other information stored in memory. The terms "code," "data," and "information" are used interchangeably herein and are not intended to limit the scope of the claims and descriptions to the types of code, data, or information used as examples in describing various embodiments.

Memory usage requirements for a use case can be stringent. The use case can require certain parameters to be met for proper function of the use case. For example, the use case can require levels of bandwidth and latency for using a double data rate (DDR) random access memory (RAM). The ability of the memory to achieve the parameters can be affected by temperature of the memory. For example, DDR memory has to increase the memory refresh rate when temperature of the DDR memory increases to certain levels in order to maintain integrity of data stored in the DDR memory. Increasing the memory refresh rate reduces read/write bandwidth and increases latency for the DDR memory. Increasing the memory refresh rate, and the effects of doing so on bandwidth and latency, can result in failure to meet the use case requirements.

Various embodiments address and overcome the foregoing issues relating to memory performance under adverse temperature conditions. Various embodiments may include using a comparison of memory characteristics and use case parameters to stored data to select a memory frequency to achieve the use case parameters for proper function of the memory in support of the use case under the temperature conditions of the memory. A memory characteristic may include a memory refresh rate that may be used as a proxy for the temperature condition of the memory. At various temperature levels of the memory, the memory may change the memory refresh rate needed for maintaining integrity of the data stored in the memory. Based in part on the memory refresh rate, the memory frequency may be selected to achieve the use case parameters for proper function of the use case under the temperature conditions of the memory. Another memory characteristic may include a memory size, as effects of temperature conditions on the memory refresh rate may differ between memories of different sizes. Based in part on the memory size, the memory frequency may be selected to achieve the use case parameters for proper function of the use case under the temperature conditions of the memory. In circumstances in which the use case parameters cannot be achieved under the temperature conditions of the memory, an alert may be generated that is configured to indicate a need to change the use case.

In some embodiments, the memory characteristics may include at least the memory refresh rate and the memory size, and the use case parameters may include at least one use case bandwidth of transmission between the memory and a system on chip (SoC) and a use case latency of transmission between the memory and the SoC. The stored data may include at least one stored memory refresh rate, at least one stored memory size, at least one stored use case bandwidth of transmission between the memory and the SoC, and at least one stored use case latency of transmission between the memory and the SoC. The comparison of the of memory characteristics and use case parameters with stored data may include comparing like types of data of the memory characteristics and the use case parameters with like types of data of the stored data. For example, comparing the memory refresh rate with the at least one stored memory refresh rate; the memory size with the at least one stored memory size; the at least one use case bandwidth with the at least one stored use case bandwidth; and/or the use case latency with the at least one stored use case latency. A memory frequency may be stored in association with the stored data that meet criteria of the comparison. The memory frequency may be selected for use in configuring the memory for the memory frequency to achieve the use case parameters for proper function of the use case under the temperature conditions of the memory.

In circumstances in which no stored data meet the criteria of the comparison, a maximum memory frequency may be selected. An alert signal configured to indicate changing the use case may be generated in the same circumstances. Selecting the maximum frequency may enable the memory to provide the greatest possible performance, in terms of bandwidth and latency, given the circumstance and the alert signal may enable a change of the use case to avoid potential issue caused by the memory failing to achieve the use case parameters.

A nonlimiting example application of various embodiments includes concurrent memory usage by multiple clients in which at least one use case requires the support of the use case parameters to achieve proper function. For example, concurrent memory usage may be implemented by a modem function and a global navigation satellite system (GNSS) receiver function. At a base memory refresh rate for the memory, which may correspond to a low temperature condition, the use case parameters for the modem function may be achieved with the concurrent traffic of the GNSS receiver function. Depending on factors such as increases of the memory refresh rate and the memory size, increased temperature conditions in the memory may affect the memory latency and/or bandwidth. The severity of such effects may vary between larger memories and smaller memories. Nevertheless, temperature conditions increasing the memory refresh rate relative to a memory refresh rate at which proper modem function may be achieved may affect the memory latency and/or bandwidth to a degree such that proper modem function may no longer be achieved. In such situations, various embodiments may be implemented to select a memory frequency associated with the memory refresh rate and the memory size at which proper modem function may be achieved.

FIG. 1 illustrates a system including a computing device 10 suitable for use with various embodiments. With reference to FIG. 1, the computing device 10 may include a system-on-chip (SoC) 12 with a processor 14, a memory 16, a communication interface 18, a storage memory interface 20, a memory interface 34, a power manager 28, a clock controller 30, a peripheral device interface 38, and an interconnect 32. The computing device 10 may further include a communication component 22, such as a wired or wireless modem, a storage memory 24, an antenna 26 for establishing a wireless communication link, a memory 36, and a peripheral device 40. The processor 14 may include any of a variety of processing devices, for example a number of processor cores.

The term "system-on-chip" (SoC) is used herein to refer to a set of interconnected electronic circuits typically, but not exclusively, including a processing device, a memory, and a communication interface. A processing device may include a variety of different types of processors 14 and processor cores, such as a general purpose processor, a central processing unit (CPU), a digital signal processor (DSP), a graphics processing unit (GPU), an accelerated processing unit (APU), a secure processing unit (SPU), a subsystem processor of specific components of the computing device, such as an image processor for a camera subsystem or a display processor for a display, an auxiliary processor, a single-core processor, a multicore processor, a controller, and a microcontroller. A processing device may further embody other hardware and hardware combinations, such as a field programmable gate array (FPGA), an application-specific integrated circuit (ASIC), other programmable logic device, discrete gate logic, transistor logic, performance monitoring hardware, watchdog hardware, and time references. Integrated circuits may be configured such that the components of the integrated circuit reside on a single piece of semiconductor material, such as silicon.

An SoC 12 may include one or more processors 14. The computing device 10 may include more than one SoC 12, thereby increasing the number of processors 14 and processor cores. The computing device 10 may also include processors 14 that are not associated with an SoC 12. The processors 14 may each be configured for specific purposes that may be the same as or different from other processors 14 of the computing device 10. One or more of the processors 14 and processor cores of the same or different configurations may be grouped together. A group of processors 14 or processor cores may be referred to as a multi-processor cluster.

The memory 16, 36 of the SoC 12 may be a volatile or non-volatile memory configured for storing data and processor-executable code for access by the processor 14. The computing device 10 and/or SoC 12 may include one or more memories 16, 36 configured for various purposes. One or more memories 16, 36 may include volatile memories such as random access memory (RAM) or main memory, including static RAM (SRAM) and/or dynamic RAM (DRAM), or cache memory. These memories 16, 36 may be configured to temporarily hold a limited amount of data received from a data sensor or subsystem, data and/or processor-executable code instructions that are requested from a non-volatile memory 16, 24, loaded to the memories 16 from the non-volatile memory 16, 24 in anticipation of future access based on a variety of factors, and/or intermediary processing data and/or processor-executable code instructions produced by the processor 14 and temporarily stored for future quick access without being stored in non-volatile memory 16, 24. The memory interface 34 and the memory 36 may work in unison to allow the computing device 10 to load and retrieve data and processor-executable code on the memory 36.

The storage memory interface 20 and the storage memory 24 may work in unison to allow the computing device 10 to store data and processor-executable code on a non-volatile storage medium. The storage memory 24 may be configured much like an embodiment of the memory 16 in which the storage memory 24 may store the data or processor-executable code for access by one or more of the processors 14. The storage memory 24, being non-volatile, may retain the information after the power of the computing device 10 has been shut off. When the power is turned back on and the computing device 10 reboots, the information stored on the storage memory 24 may be available to the computing device 10. The storage memory interface 20 may control access to the storage memory 24 and allow the processor 14 to read data from and write data to the storage memory 24.

The power manager 28 may be configured to control power states of one or more power rails (not shown) for power delivery to the components of the SoC 12. In some embodiments, the power manager 28 may be configured to control amounts of power provided to the components of the SoC 12. For example, the power manager 28 may be configured to control connections between components of the SoC 12 and the power rails. As another example, the power manager 28 may be configured to control amounts of power on the power rails connected to the components of the SoC 12. The power manager 28 may be configured as a power management integrated circuit (power management ICs or PMIC).

A clock controller 30 may be configured to control clock signals transmitted to the components of the SoC 12. For example, the clock controller 30 may gate a component of the SoC 12 by disconnecting the component of the SoC 12 from a clock signal and may ungate the component of the SoC 12 by connecting the component of the SoC 12 to the clock signal.

A peripheral device interface 38 may enable components of the SoC 12, such as the processor 14 and/or the memory 16, to communicate with a peripheral device 40. The peripheral device interface 38 may provide and manage physical and logical connections between the components of the SoC 12 and the peripheral device 40. The peripheral device interface 38 may also manage communication between the components of the SoC 12 and the peripheral device 40, such as by directing and/or allowing communications between transmitter and receiver pairs of the components of the SoC 12 and the peripheral device 40 for a communication. The communications may include transmission of memory access commands, addresses, data, interrupt signals, state signals, etc. A peripheral device 40 may be any component of the computing device 10 separate from the SoC 12, such as a processor, a memory, a subsystem, etc. In some embodiments, the peripheral device interface 38 may include a PCIe root complex and may enable PCIe protocol communication between the components of the SoC 12 and the peripheral device 40.

The interconnect 32 may be a communication fabric, such as a communication bus, configured to communicatively connect the components of the SoC 12. The interconnect 32 may transmit signals between the components of the SoC 12. In some embodiments, the interconnect 32 may be configured to control signals between the components of the SoC 12 by controlling timing and/or transmission paths of the signals.

Figure 2:
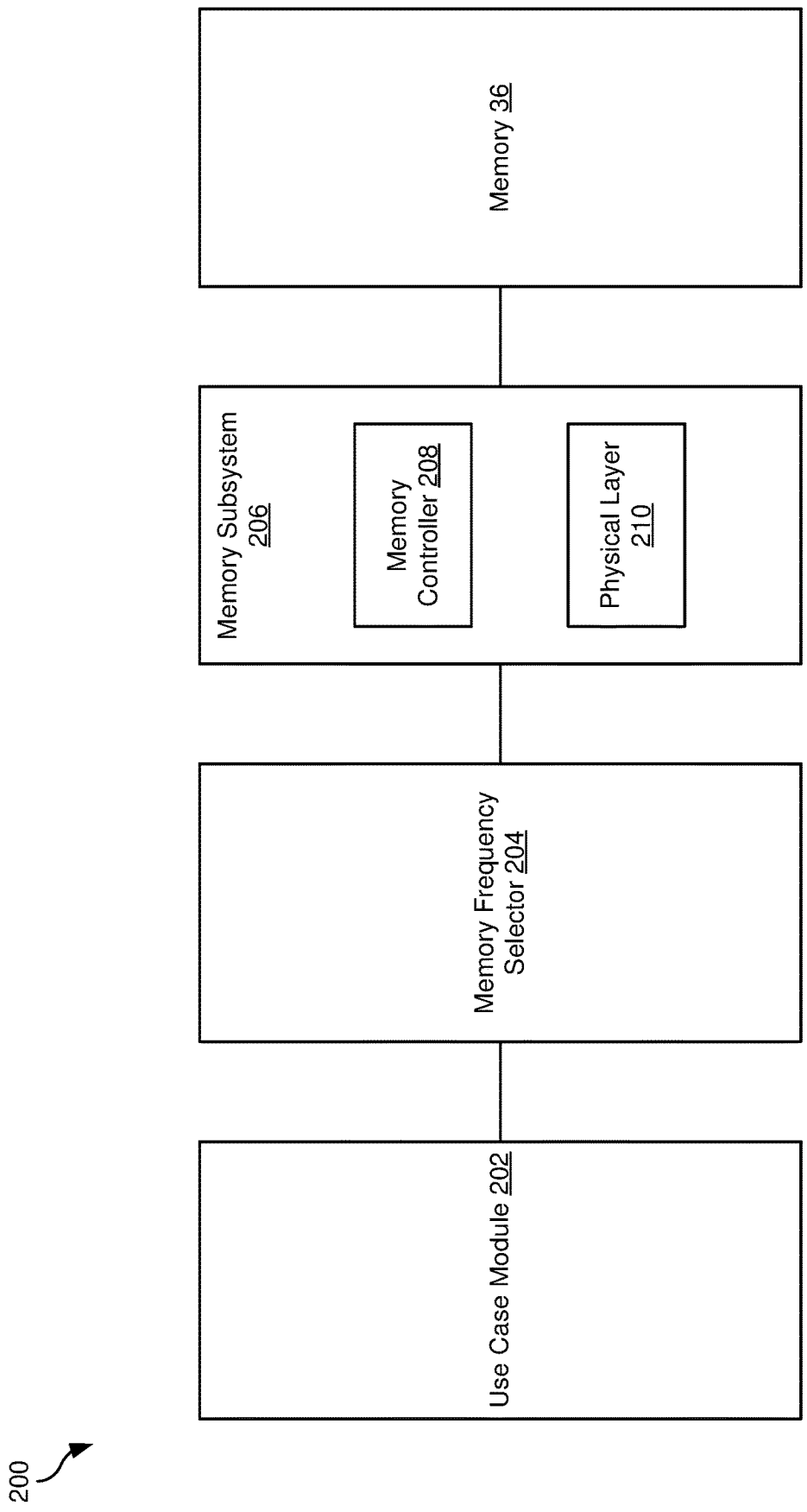
FIG. 2 is a component block diagram illustrating an example system of the computing device suitable for implementing various embodiments.

Some or all of the components of the computing device 10 and/or the SoC 12 may be arranged differently and/or combined while still serving the functions of the various embodiments. The computing device 10 may not be limited to one of each of the components, and multiple instances of each component may be included in various configurations of the computing device FIG. 2 illustrates an example system 200 of the computing device (e.g., computing device 10 in FIG. 1) suitable for implementing various embodiments. With reference to FIGS. 1 and 2, the system 200 may include a use case module 202 (e.g., processor 14, communication component 22, peripheral device 40 in FIG. 1), a memory frequency selector 204, a memory subsystem 206 (e.g., memory interface 34 in FIG. 1), and the memory 36. Various components of the system 200 may be variably arranged and may be integral and/or separate from an SoC (e.g., SoC 12 in FIG. 1).

The use case module 202 may include any composition of hardware, software, and/or firmware configured to implement a use case and to provide the use case parameters for proper functioning of the use case. Nonlimiting examples of use cases include telecommunication functions, audio/video functions, electromagnetic radiation signal processing functions, artificial intelligence (AI) functions, automated navigation functions, mechanical safety system functions, etc. The use case module 202 may transmit use case parameters required for proper functioning of the use case to the memory frequency selector 204. Such use case parameters may include information regarding use case bandwidth of transmission between the memory 36 and the SoC, such as a use case current bandwidth at a time and a use case average bandwidth over a period of time, and a use case latency of transmission between the memory 36 and the SoC.

The memory 36 may include any memory configured to store data enabling the use case module 202 to implement the use case. In a nonlimiting example, the memory 36 may be a DDR memory. In some examples, the memory 36 may be a DDR synchronous dynamic RAM (SDRAM) separate from the SoC 12.

The memory 36 may be configured with various temperature thresholds at which the memory 36 may be configured to change a memory refresh rate in response to a temperature condition in the memory 36 reaching and/or crossing the temperature threshold. For example, a temperature condition reaching and/or exceeding a temperature threshold may prompt the memory 36 to increase a memory refresh rate, and a temperature condition reaching and/or falling below a temperature threshold may prompt the memory 36 to decrease a memory refresh rate. In a nonlimiting example, a base memory refresh rate may be a lowest memory refresh rate and may be referred to as 1×. Higher memory refresh rates may be referred to as multiples of the base memory refresh rate, such as 2×, 4×, etc. Higher memory refresh rates may cause the memory 36 to implement a memory refresh more frequently than lower memory refresh rates. For example, a 1× memory refresh rate may refresh every 4 ms, a 2× memory refresh rate may refresh every 2 ms, a 4× memory refresh rate may refresh every 1 ms, etc.

The memory subsystem 206 may include any composition of hardware, software, and/or firmware, such as a memory controller 208 and a physical layer 210, configured to provide and manage physical and logical connections and manage communication between the use case module 202 and the memory 36. Such communications may include data access commands and data transmitted between the use case module 202 and the memory 36. In some examples, various components of the memory subsystem 206 may be integral to and/or separate from the SoC and/or the memory 36. The memory subsystem 206 may be configured to periodically, continually, or episodically poll the memory 36 for the memory refresh rate of the memory 36. The memory subsystem 206 may transmit the memory refresh rate to the memory frequency selector 204.

The memory frequency selector 204 may include any composition of hardware, software, and/or firmware configured to select a memory frequency for configuring the memory 36 to operate at the memory frequency. The memory frequency selector 204 may receive use case parameters from the use case module 202 and the memory refresh rate from the memory subsystem 206. The memory frequency selector 204 may be programmed with a memory size of the memory 36. In some examples, the memory frequency selector 204 may store an information structure, as described further herein, in a memory (e.g., a look up table not shown) configured to store memory characteristics and use case parameters in association with memory frequencies. The memory frequencies associated with the memory characteristics and the use case parameters may be configured to enable proper use case function for the memory 36 configured with the memory frequency while exhibiting the memory characteristics and the use case parameters.

The memory frequency selector 204 may compare use case parameters and memory characteristics to stored data to select the memory frequency. For example, comparing memory characteristics of at least the memory refresh rate and the memory size and use case parameters of at least one use case bandwidth of transmission between the memory 36 and the SoC, and a use case latency of transmissions between the memory and the SoC with stored data of at least one stored memory refresh rate, at least one stored memory size, at least one stored use case bandwidth of transmission between the memory and the SoC, and at least one stored use case latency of transmission between the memory and the SoC. In some examples, the memory frequency selector 204 may compare the data stored in the information structure with the memory characteristics and the use case parameters.

From comparing the memory characteristics and the use case parameters with the stored data, the memory frequency selector 204 may identify the stored memory refresh rate matching the memory refresh rate; identify the stored memory size matching the memory size; identify the at least one stored use case bandwidth matching the at least one use case bandwidth; identify the stored use case latency matching the use case latency; and identify the memory frequency stored in association with the stored memory refresh rate, the stored memory size, the at least one stored use case bandwidth, and the stored use case latency. The memory frequency selector 204 may transmit the memory frequency to the memory subsystem 206, which may use the memory frequency to configure the memory 36.

In some cases, the memory frequency selector 204 may fail to identify at least one of the at least one stored use case bandwidth matching the at least one use case bandwidth or the stored use case latency matching the use case latency. In response to this failure, the memory frequency selector 204 may select a maximum memory refresh rate for the memory 36. The memory frequency selector 204 may transmit the memory frequency to the memory subsystem 206, which may use the memory frequency to configure the memory 36. In some embodiments, the memory frequency selector 204 may generate an alarm signal configured to indicate a need to change the use case to be able to achieve use case parameters based on the memory characteristics being unable to achieve the use case parameters. The memory frequency selector 204 may send the alarm signal to client of the computing device, such as the use case module 202.

Figure 3:
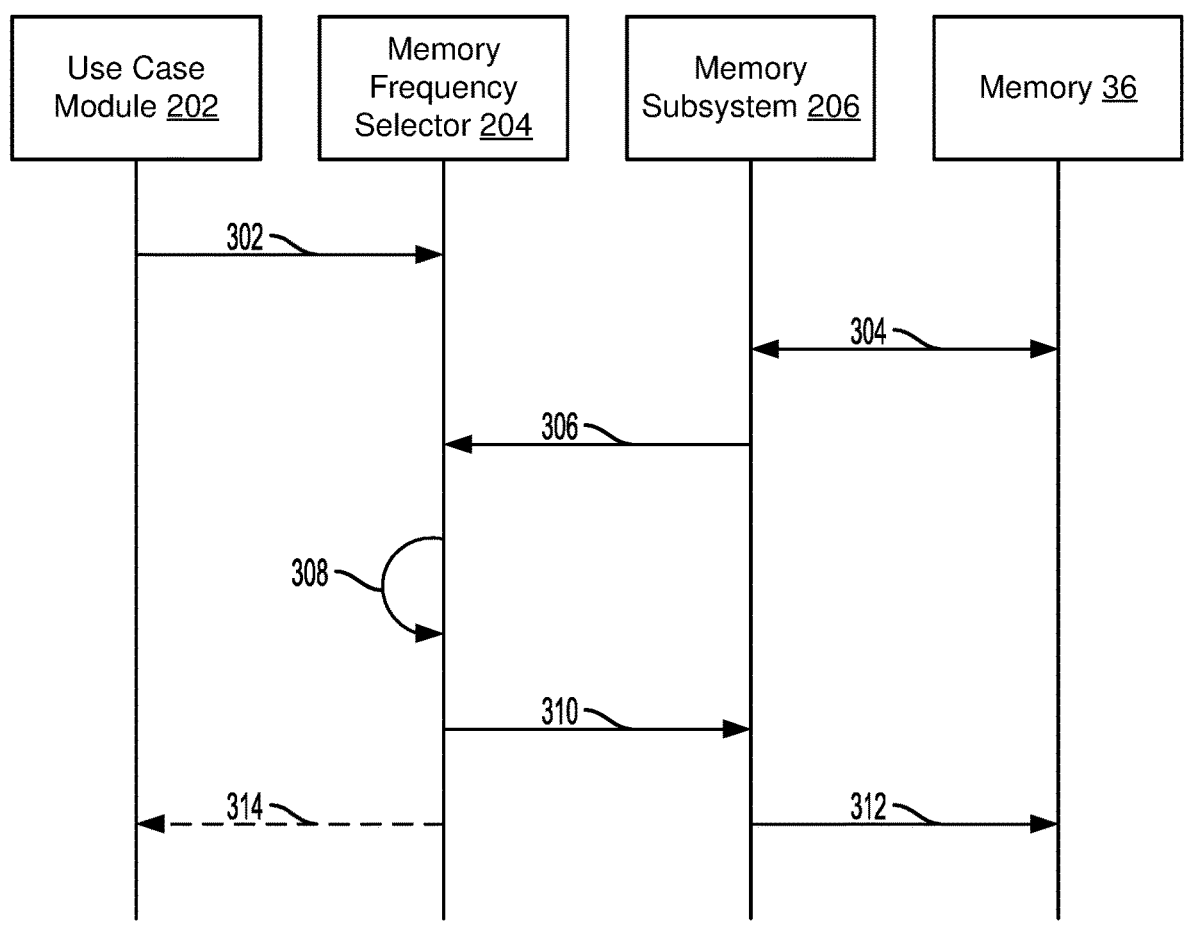
FIG. 3 is a component block and signaling diagram illustrating an example of the system implementing dynamic DDR scaling and use case management based on DDR refresh rate and size suitable for implementing various embodiments.

FIG. 3 illustrates an example of the system (e.g., system 200) implementing dynamic DDR scaling and use case management based on DDR refresh rate and size suitable for implementing various embodiments. With reference to FIGS. 1-3, the system may include the use case module 202, the memory frequency selector 204, the memory subsystem 206, and the memory 36. The components of the system may be configured to transmit signals between the components via communication buses (not shown) and/or process computer code instructions and/or data.

The use case module 202 may send the use case parameters to the memory frequency selector 204 via a signal 302. The use case parameters may include the at least one use case bandwidth, such as the use case current bandwidth and the use case average bandwidth, and the use case latency for proper implementation of a use case function by the use case module 202. The memory frequency selector 204 may receive the use case parameters from the use case module 202 via the signal 302.

The memory subsystem 206 may request the memory 36 for the memory refresh rate of the memory 36, the memory 36 receive the request and may return the memory refresh rate to the memory subsystem 206, and the memory subsystem 206 may receive the memory refresh rate via signals 304. The memory subsystem 206 may request the memory refresh rate from the memory 36 continually, periodically, and/or episodically. The memory 36 may respond to the requests continually, periodically, and/or episodically. For example, the memory 36 may respond to each request received from the memory system 208. For another example, the memory 36 may respond to a request from the memory subsystem 206 in response to a change in the memory refresh rate of the memory 36 since a last response was sent to the memory subsystem 206.

The memory subsystem 206 may forward the memory refresh rate of the memory 36 to the memory frequency selector 204, and the memory frequency selector 204 may receive the memory refresh rate via a signal 306. The memory frequency selector 204 may use the received memory refresh rate to select a memory frequency for which to configure the memory 36 via a process 308. The memory frequency selector 204 may compare the received at least one use case bandwidth, the received use case latency, the received memory refresh rate, and/or a programmed memory size for the memory 36 to data stored at an information structure, to select the memory frequency. In response to finding a memory frequency stored in association with the received at least one use case bandwidth, the received use case latency, the received memory refresh rate, and the programmed memory size, the memory frequency selector 204 may select the memory frequency. In response to failing to find a memory frequency stored in association with the received at least one use case bandwidth, the received use case latency, the received memory refresh rate, and the programmed memory size, the memory frequency selector 204 may select a maximum memory frequency for the memory 36.

Whether selecting the memory frequency stored in association with a memory frequency stored in association with the received at least one use case bandwidth, the received use case latency, the received memory refresh rate, and the programmed memory size, or the maximum memory frequency, the memory frequency selector 204 may send the selected memory frequency to the memory subsystem 206 via a signal 310. The memory subsystem 206 may receive the selected memory frequency via the signal 310 and use the selected memory frequency to configure the memory for the selected memory frequency via a signal 312.

In response to selecting the maximum memory frequency, the memory frequency selector 204 may send an alert to the use case module 202 via a signal 314. The alert may be configured to indicate changing the use case, for the memory 36 to be able to enable proper use case function. Following receipt of the alert via signal 314, the use case module 202 may change the use case and send use case parameters and/or representation of the use case parameters, such as a use case identifier, for the use case to the memory frequency selector 204 via the signal 302.

FIG. 4 illustrates an example information structure 400 for implementing dynamic DDR scaling and use case management based on DDR refresh rate and size according to an embodiment. With reference to FIGS. 1-4 the information structure 400 may be stored in a memory (e.g., memory 16 in FIG. 1, memory 36 in FIGS. 1-3) at and/or accessible to the memory frequency selector (e.g., memory frequency selector 204 in FIGS. 2 and 3). The information structure 400 may be preprogrammed and/or populated for a use case implemented by the use case module (e.g., use case module 202 in FIGS. 2 and 3). The information structure 400 may be configured with data for at least one use case and at least one memory (e.g., memory 36 in FIGS. 1-3).

The information structure 400 stored in the memory may include data, which may be referred to herein as "stored" data, relating to each of one or more use cases. In the example illustrated in FIG. 4 each row may represent the data relating to a use case. For example, the information structure 400 may include data relating to the at least one use case, such as at least one type of use case bandwidth, including a stored use case current bandwidth and/or a stored use case average bandwidth, and a stored use case latency. The information structure 400 may include data relating to the at least one memory, including a stored memory size, a stored memory refresh rate, and a memory frequency. An association in the information structure 400 between data relating to the at least one use case and the at least one memory may be data for the at least one memory to be enable proper function of the at least one use case. Further, the information structure 400 may include only a subset of possible use cases.

In some embodiments, the information structure 400 stored in the memory may include data, which may be referred to herein as "stored" data, for more than one use case, such as up to M number of use cases, where M is a number greater than 1. In the non-limiting example illustrated in FIG. 4, the information structure 400 includes data for more than one use case, including "Use case 1," "Use case M-N," where N is a number between M and 1, and "Use case M." For example, each row in the information structure 400 may be an association of data relating to a use case of the more than one use cases and data relating to the at least one memory. For example, each row in the information structure 400 may include the stored use case current bandwidth, the stored use case average bandwidth, the stored use case latency, the stored memory size, the stored memory refresh rate, and the memory frequency. Optionally, each row may also include a use case identifier (ID) associated with the data relating to the use case.

The memory frequency selector may compare any one or more of the at least one use case bandwidth and/or the use case latency received from the use case module with a corresponding one or more of the at least one stored use case bandwidth and the stored use case latency of the information structure 400. For example, the memory frequency selector may compare the at least one use case bandwidth and the use case latency received from the use case module with the at least one stored use case bandwidth and the stored use case latency of the information structure 400. The memory frequency selector may compare any one or more of the programmed memory size and the memory refresh rate received from the memory subsystem (e.g., memory subsystem 206 in FIGS. 2 and 3) with a corresponding one or more of the stored memory size and the stored memory refresh rate of the information structure 400. For example, the memory frequency selector may compare the programmed memory size and the memory refresh rate received from the memory subsystem with the stored memory size and the stored memory refresh rate of the information structure 400. Based on matching at least one, up to all, of the items of an association of data in the information structure, the memory frequency selector may select an associated memory frequency.

Figure 5:
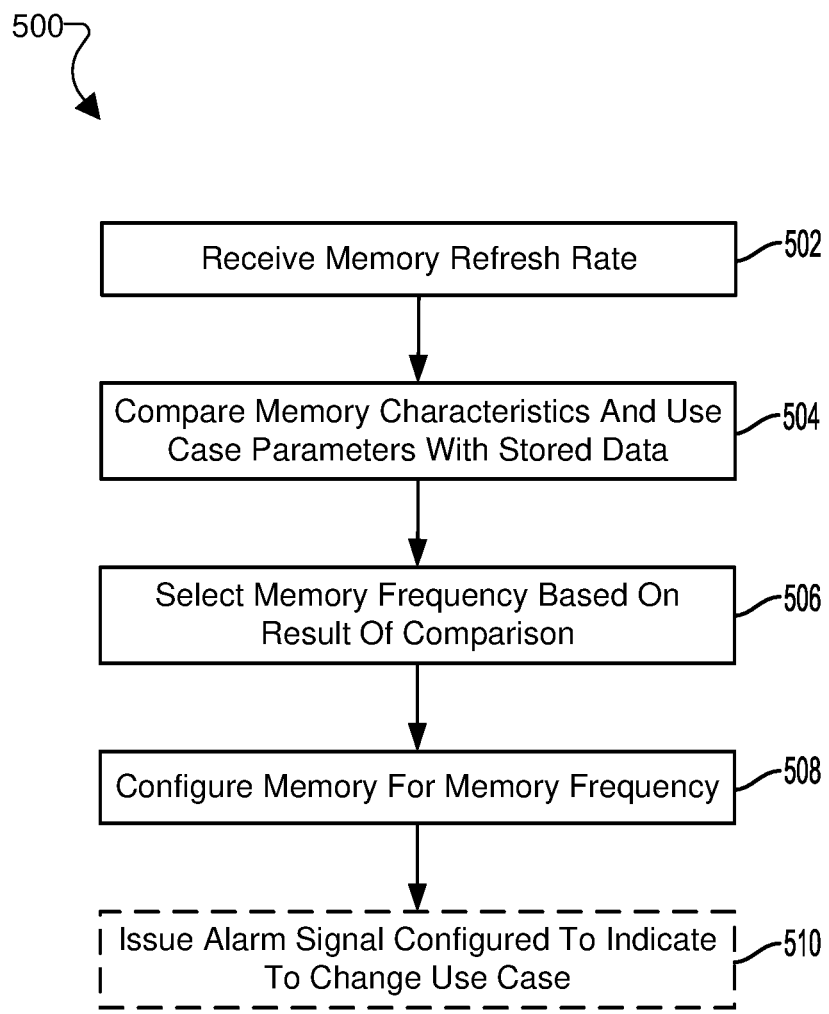
FIG. 5 is a process flow diagram illustrating an example method for implementing dynamic DDR scaling and use case management based on DDR refresh rate and size according to an embodiment.

FIG. 5 illustrates an example method 500 for implementing dynamic DDR scaling and use case management based on DDR refresh rate and size according to various embodiments. With reference to FIGS. 1-5, the method 500 may be implemented in a computing device (e.g., computing device 10 in FIG. 1, SoC 12 in FIGS. 1 and 2, system 200 in FIG. 2), in hardware (e.g., memory interface 34, memory frequency selector 204 in FIGS. 2 and 3), in software (e.g., memory frequency selector 204 in FIGS. 2 and 3) executing in a processor (e.g., processor 14, memory interface 34 in FIG. 1), or in a combination of a software-configured processor and dedicated hardware, such as the system (e.g., system 200 in FIG. 2), that includes other individual components, such as various memories/caches (e.g., memory 16, 24 in FIG. 1, memory 36 in FIGS. 1-3) and various memory/cache controllers (e.g., memory interface 34 in FIG. 1, memory subsystem 206 in FIGS. 2 and 3). In order to encompass the alternative configurations enabled in various embodiments, the hardware implementing the method 500 is referred to herein as a "memory frequency device."

In block 502, the memory frequency device may receive a memory refresh rate of a memory (e.g., memory 36 in FIGS. 1-3). The memory refresh rate may be received from the memory, such as via a memory subsystem (e.g., memory subsystem 206 in FIGS. 2 and 3). The memory refresh rate may be a proxy for a temperature condition of the memory, as the memory may be configured with temperature thresholds at which the memory may raise and/or lower the memory refresh rate. In some embodiments, the memory frequency device receiving the memory refresh rate of the memory in block 502 may be a processor (e.g., processor 14 in FIG. 1) and/or a memory frequency selector (e.g., memory frequency selector 202 in FIGS. 2 and 3).

In block 504, the memory frequency device may compare memory characteristics and use case parameters with stored data of stored memory characteristics and stored use case parameters. The use case parameters may be received from a use case module (e.g., use case module 202 in FIGS. 2 and 3) and may be parameters for the memory to enable proper function of the use case. Comparing the memory characteristics and the use case parameters with the stored data is described further herein for the methods 600*a*, 600*b* with reference to FIGS. 6A and 6B. In some embodiments, the memory frequency device comparing the memory characteristics and the use case parameters with the stored data in block 504 may be the processor and/or the memory frequency selector.

The use case parameters used in block 504 may include at least one use case bandwidth, such as a use case current bandwidth at a time and a use average case bandwidth over a period, and a use case latency. The memory characteristics used in block 504 may include the memory refresh rate received in block 502 and a memory size of the memory, which may be preprogrammed.

The stored data compared in block 504 may include data stored at an information structure (e.g., information structure 400 in FIG. 4) configured to associate the stored memory characteristics and stored use case parameters with a memory frequency configured for the memory to enable proper function of the use case. For example, the stored use case parameters may include at least one stored use case bandwidth, such as a stored use case current bandwidth at a time and a stored use case average bandwidth over a period, and a stored use case latency. The memory characteristics may include a stored memory refresh rate and a stored memory size of the memory.

In block 506, the memory frequency device may select a memory frequency based on a result of the comparison. Matching all of the items associated with the memory frequency may result in selecting the memory frequency. Failing to match at least one item associated with any memory frequency may result in selecting a maximum memory frequency for the memory. Selecting the memory frequency based on the result of the comparison is described further herein for the methods 600*a*, 600*b* with reference to FIGS. 6A and 6B. In some embodiments, the memory frequency device selecting the memory frequency based on the result of the comparison in block 506 may be the processor and/or the memory frequency selector.

In block 508, the memory frequency device may configure the memory for the memory frequency. The memory frequency may be the memory frequency selected in block 506. The memory frequency device may generate and send a signal indicating the memory frequency for configuring the memory to the memory subsystem. Sending the signal indicating the memory frequency may prompt the memory subsystem to configure the memory for the memory frequency. In some embodiments, the memory frequency device configuring the memory for the memory frequency in block 508 may include the processor, the memory frequency selector, and/or the memory subsystem.

In optional block 510, the memory frequency device may issue an alarm signal configured to indicate changing the use case to enable the memory to achieve the use case parameters for proper use case function. Implementation of block 510 may be optional in that implementation may be in response to failing to match at least one item associated with any memory frequency in block 506. The memory frequency device may generate and send the alarm signal to the use case module, which may respond by changing the use case and sending use case parameters and/or a representation of the use case parameters, such as a use case ID, to the memory frequency device. In some embodiments, the memory frequency device issuing the alarm signal in block 510 may include the processor and/or the memory frequency selector.

Figure 6A:
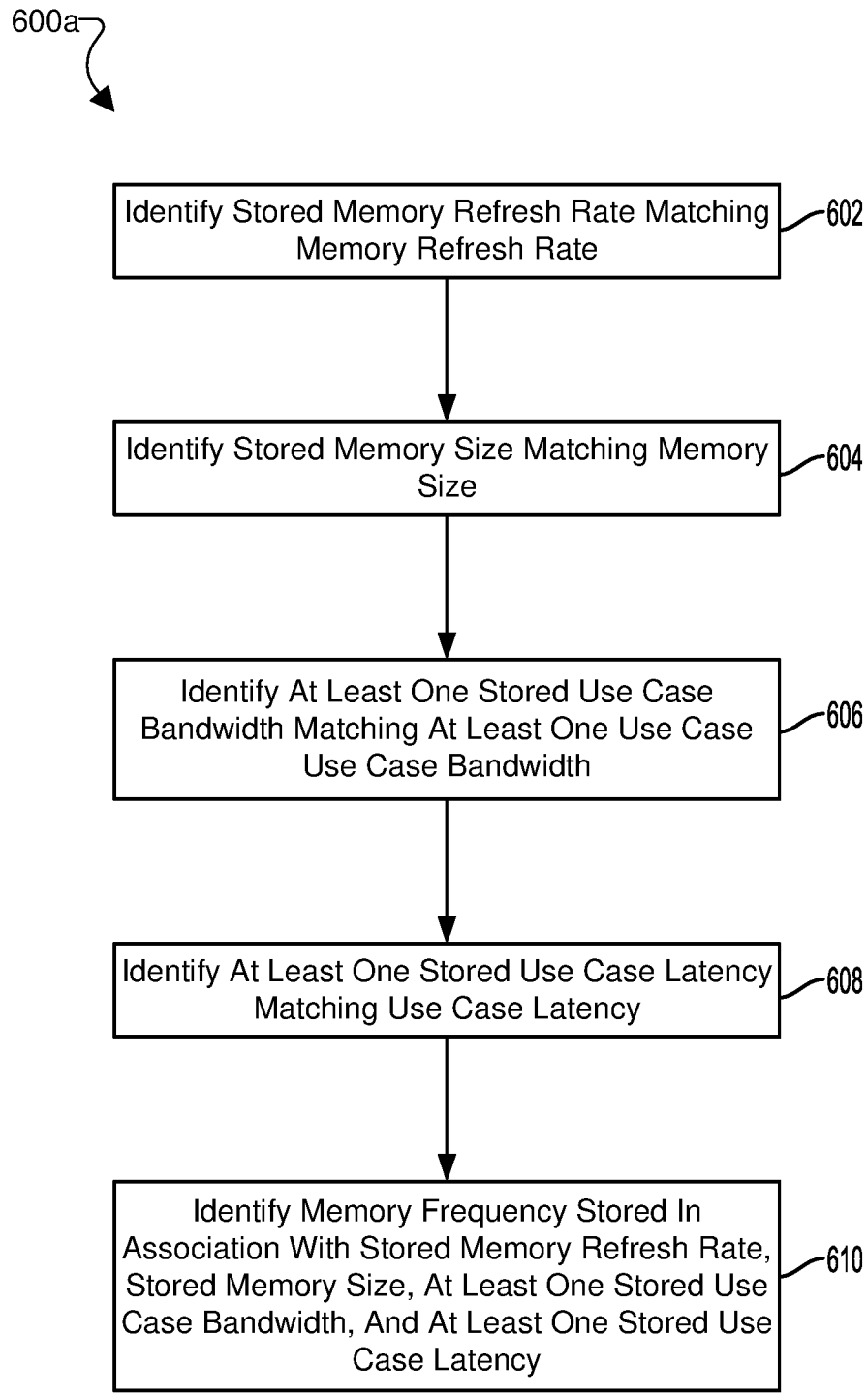
FIGS. 6A and 6B are process flow diagrams illustrating example methods for implementing dynamic DDR scaling and use case management based on DDR refresh rate and size according to an embodiment.
Figure 6B:
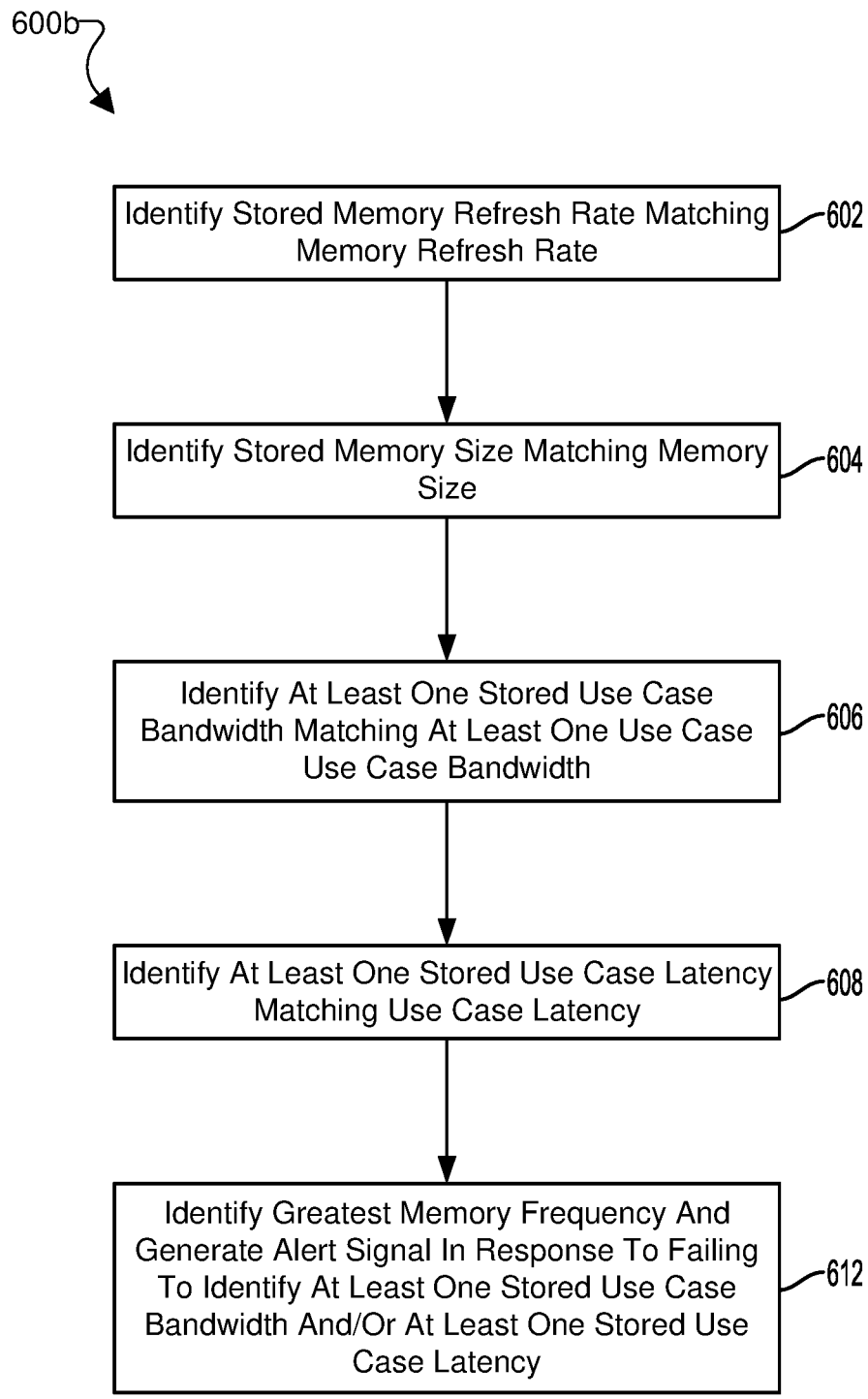

FIGS. 6A and 6B illustrate example methods 600a, 600b for implementing dynamic DDR scaling and use case management based on DDR refresh rate and size according to various embodiments. With reference to FIGS. 1-6B, the methods 600a, 600b may be implemented in a computing device (e.g., computing device 10 in FIG. 1, SoC 12 in FIGS. 1 and 2, system 200 in FIG. 2), in hardware (e.g., memory interface 34, memory frequency selector 204 in FIGS. 2 and 3), in software (e.g., memory frequency selector 204 in FIGS. 2 and 3) executing in a processor (e.g., processor 14, memory interface 34 in FIG. 1), or in a combination of a software-configured processor and dedicated hardware, such as the system (e.g., system 200 in FIG. 2), that includes other individual components, such as various memories/caches (e.g., memory 16, 24 in FIG. 1, memory 36 in FIGS. 1-3) and various memory/cache controllers (e.g., memory interface 34 in FIG. 1, memory subsystem 206 in FIGS. 2 and 3). In order to encompass the alternative configurations enabled in various embodiments, the hardware implementing the methods 600a, 600b is referred to herein as a "memory frequency device."

Blocks 602-608 of the methods 600a, 600b may be implemented in a similar manner and are described once with reference to FIGS. 6A and 6B for the methods 600a, 600b unless otherwise specified. Blocks 602-608 may be implemented in any order and any of 602-608 may be implemented serially and/or in parallel.

In block 602, the memory frequency device may identify a stored memory refresh rate matching a memory refresh rate of a memory (e.g., memory 36 in FIGS. 1-3). The stored memory refresh rate may be retrieved from the information structure (e.g., information structure 400 in FIG. 4) configured to associate the stored memory characteristics and stored use case parameters with a memory frequency configured for the memory to enable proper function of the use case. The memory refresh rate may be the memory refresh rate received in block 502 of the method 500 described herein with reference to FIG. 5. The memory frequency device may compare at least one stored memory refresh rate with the memory refresh rate to identify which at least one stored memory refresh rate matches the memory refresh rate. In some embodiments, the memory frequency device identifying the stored memory refresh rate matching the memory refresh rate in block 602 may be a processor (e.g., processor 14 in FIG. 1) and/or a memory frequency selector (e.g., memory frequency selector 202 in FIGS. 2 and 3).

In block 604, the memory frequency device may identify a stored memory size matching a memory size of the memory. The stored memory size may be retrieved from the information structure and the memory size may be programmed to the memory frequency device. The memory frequency device may compare at least one stored memory size with the memory size to identify which at least one stored memory size matches the memory size. In some embodiments, the memory frequency device identifying the stored memory size matching the memory size in block 604 may be the processor and/or the memory frequency selector.

In block 606, the memory frequency device may identify at least one stored use case bandwidth matching at least one use case bandwidth. The at least one stored use case bandwidth may include a stored use case current bandwidth at a time and/or a stored use case average bandwidth over a period that may be retrieved from the information structure. The at least one use case bandwidth may include a use case current bandwidth at a time and/or a use case average bandwidth over a period that may be received from a use case module (e.g., use case module 202 in FIGS. 2 and 3). The memory frequency device may compare the at least one stored use case bandwidth with the at least one use case bandwidth to identify which at least one stored use case bandwidth matches the at least one use case bandwidth. In some embodiments, the memory frequency device identifying the at least one stored use case bandwidth matching the at least one use case bandwidth in block 606 may be the processor and/or the memory frequency selector.

In block 608, the memory frequency device may identify at least one stored use case latency matching a use case latency. The at least one stored use case latency may be retrieved from the information structure. The use case latency may be received from the use case module. The memory frequency device may compare the at least one stored use case latency with the use case latency to identify which at least one stored use case latency matches the use case latency. In some embodiments, the memory frequency device identifying the at least one stored use case latency matching the use case latency in block 608 may be the processor and/or the memory frequency selector.

With reference to FIG. 6A, in block 610, the memory frequency device may identify a memory frequency stored in association with the stored memory refresh rate, the stored memory size, the at least one stored use case bandwidth, and the at least one stored use case latency. The information structure may be configured to associate the stored memory refresh rate, the stored memory size, the at least one stored use case bandwidth, and the at least one stored use case latency with a memory frequency configured for the memory to enable proper function of the use case. The memory frequency device may identify the memory frequency on the basis of identifying the stored memory refresh rate, the stored memory size, the at least one stored use case bandwidth, and the at least one stored use case latency from comparison with the memory refresh rate, the memory size, the at least one use case bandwidth, and the use case latency. In some embodiments, the memory frequency device identifying the memory frequency stored in association with the stored memory refresh rate, the stored memory size, the at least one stored use case bandwidth, and the at least one stored use case latency in block 610 may be the processor and/or the memory frequency selector.

With reference to FIG. 6B, in block 612, the memory frequency device may identify a greatest memory frequency and generate an alert signal in response to failing to identify at least one stored use case bandwidth and/or at least one stored use case latency. Failing to identify at least one stored use case bandwidth and/or at least one stored use case latency may be the result of no combination of the stored memory refresh rate, the stored memory size, the at least one stored use case bandwidth, and the at least one stored use case latency matching the memory refresh rate, the memory size, the at least one use case bandwidth, and the use case latency. A such, there may not be a memory frequency for the memory to enable proper function of the use case with the at least one use case bandwidth, and the use case latency.

However, there may be a memory frequency for the memory to enable proper function of the use case with at least one different use case bandwidth and/or different use case latency. The alert signal may be configured to prompt a change in the use case. While no configuration of the memory satisfies the at least one use case bandwidth and/or the use case latency, the memory may be configured with a maximum frequency to enable the highest performance possible in terms of bandwidth and/or latency. In some embodiments, the memory frequency device identifying the greatest memory frequency and generating the alert signal in response to failing to identify at least one stored use case bandwidth and/or at least one stored use case latency in block 612 may be the processor and/or the memory frequency selector.

Figure 7:
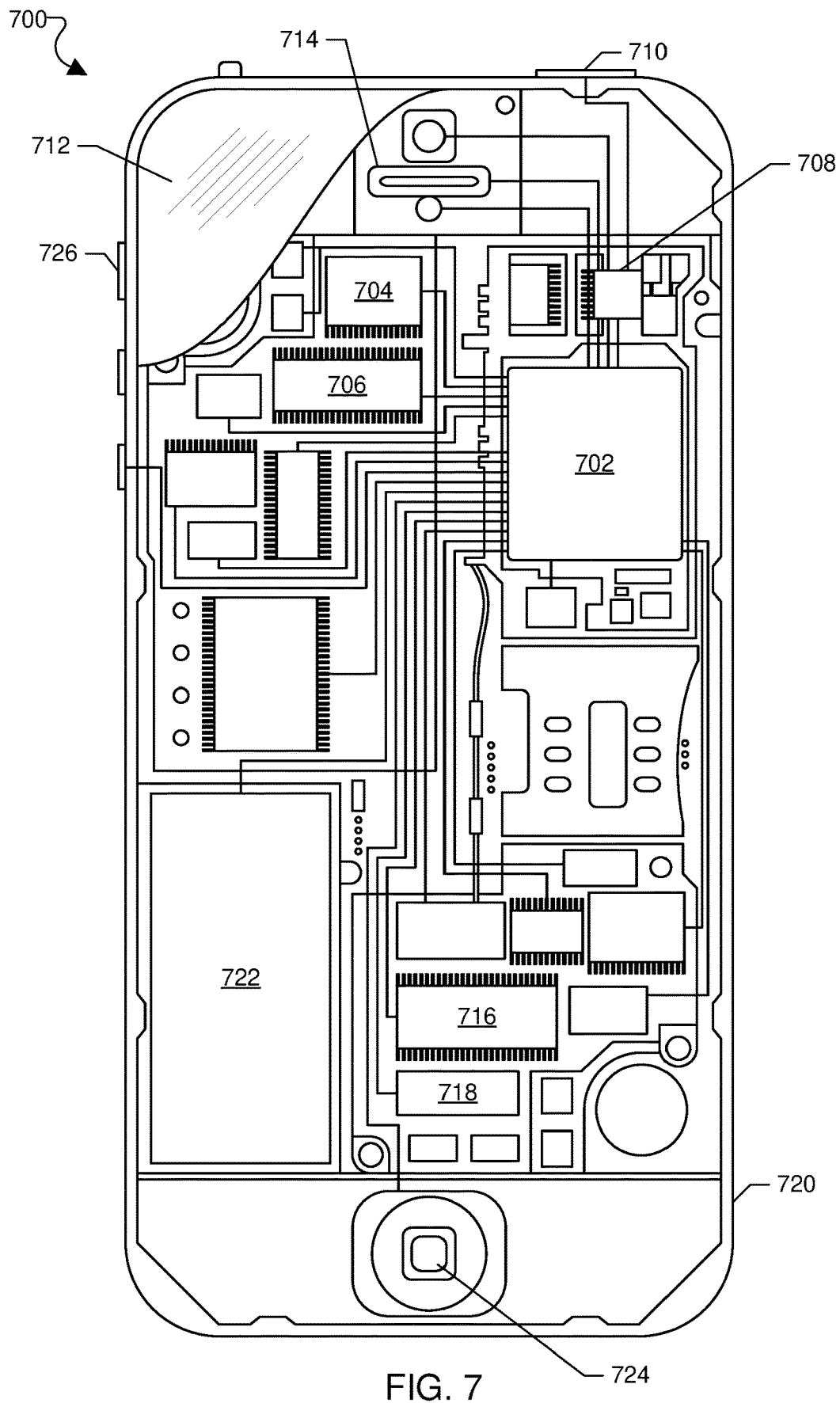
FIG. 7 is a component block diagram illustrating an example mobile computing device suitable for implementing various embodiments.

A system in accordance with the various embodiments (including, but not limited to, embodiments described above with reference to FIGS. 1-6B) may be implemented in a wide variety of computing systems including mobile computing devices, an example of which suitable for use with the various embodiments is illustrated in FIG. 7. The mobile computing device 700 may include a processor 702 coupled to a touchscreen controller 704 and an internal memory 706. The processor 702 may be one or more multicore integrated circuits designated for general or specific processing tasks. The internal memory 706 may be volatile or non-volatile memory, and may also be secure and/or encrypted memory, or unsecure and/or unencrypted memory, or any combination thereof. Examples of memory types that can be leveraged include but are not limited to DDR, Low-Power DDR (LPDDR), Graphics DDR (GDDR), WIDEIO, RAM, Static RAM (SRAM), Dynamic RAM (DRAM), Parameter RAM (P-RAM), Resistive RAM (R-RAM), Magnetoresistive RAM (M-RAM), Spin-Transfer Torque RAM (STT-RAM), and embedded DRAM. The touchscreen controller 704 and the processor 702 may also be coupled to a touchscreen panel 712, such as a resistive-sensing touchscreen, capacitive-sensing touchscreen, infrared sensing touchscreen, etc. Additionally, the display of the mobile computing device 700 need not have touch screen capability.

The mobile computing device 700 may have one or more radio signal transceivers 708 (e.g., Peanut, Bluetooth, Zig-Bee, Wi-Fi, RF radio) and antennae 710, for sending and receiving communications, coupled to each other and/or to the processor 702. The transceivers 708 and antennae 710 may be used with the above-mentioned circuitry to implement the various wireless transmission protocol stacks and interfaces. The mobile computing device 700 may include a cellular network wireless modem chip 716 that enables communication via a cellular network and is coupled to the processor.

The mobile computing device 700 may include a peripheral device connection interface 718 coupled to the processor 702. The peripheral device connection interface 718 may be singularly configured to accept one type of connection, or may be configured to accept various types of physical and communication connections, common or proprietary, such as Universal Serial Bus (USB), FireWire, Thunderbolt, or PCIe. The peripheral device connection interface 718 may also be coupled to a similarly configured peripheral device connection port (not shown).

The mobile computing device 700 may also include speakers 714 for providing audio outputs. The mobile computing device 700 may also include a housing 720, constructed of a plastic, metal, or a combination of materials, for containing all or some of the components described herein. The mobile computing device 700 may include a power source 722 coupled to the processor 702, such as a disposable or rechargeable battery. The rechargeable battery may also be coupled to the peripheral device connection port to receive a charging current from a source external to the mobile computing device 700. The mobile computing device 700 may also include a physical button 724 for receiving user inputs. The mobile computing device 700 may also include a power button 726 for turning the mobile computing device 700 on and off.

Figure 8:
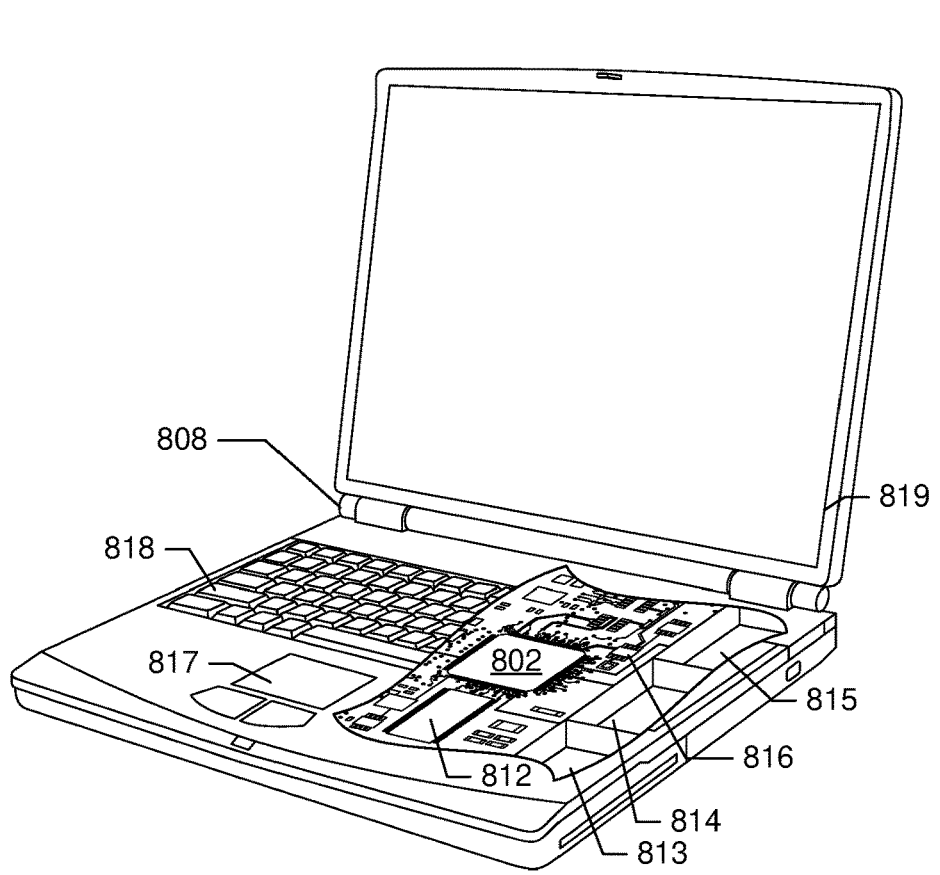
FIG. 8 is a component block diagram illustrating an example mobile computing device suitable for implementing various embodiments.

A system in accordance with the various embodiments (including, but not limited to, embodiments described above with reference to FIGS. 1-6B) may be implemented in a wide variety of computing systems include a laptop computer 800, an example of which is illustrated in FIG. 8. Many laptop computers include a touchpad touch surface 817 that serves as the computer's pointing device, and thus may receive drag, scroll, and flick gestures similar to those implemented on computing devices equipped with a touch screen display and described above. A laptop computer 800 will typically include a processor 802 coupled to volatile memory 812 and a large capacity nonvolatile memory, such as a disk drive 813 of Flash memory. Additionally, the computer 800 may have one or more antenna 808 for sending and receiving electromagnetic radiation that may be connected to a wireless data link and/or cellular telephone transceiver 816 coupled to the processor 802. The computer 800 may also include a floppy disc drive 814 and a compact disc (CD) drive 815 coupled to the processor 802. In a notebook configuration, the computer housing includes the touchpad 817, the keyboard 818, and the display 819 all coupled to the processor 802. Other configurations of the computing device may include a computer mouse or trackball coupled to the processor (e.g., via a USB input) as are well known, which may also be used in conjunction with the various embodiments.

Figure 9:
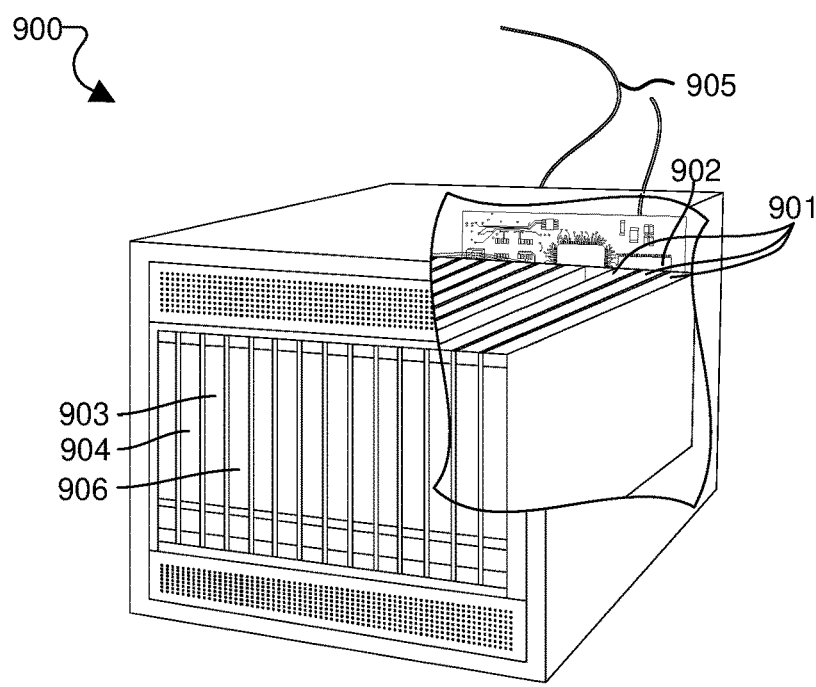
FIG. 9 is a component block diagram illustrating an example server suitable for implementing various embodiments.

A system in accordance with the various embodiments (including, but not limited to, embodiments described above with reference to FIGS. 1-6B) may also be implemented in fixed computing systems, such as any of a variety of commercially available servers. An example server 900 is illustrated in FIG. 9. Such a server 900 typically includes one or more multicore processor assemblies 901 coupled to volatile memory 902 and a large capacity nonvolatile memory, such as a disk drive 904. As illustrated in FIG. 9, multicore processor assemblies 901 may be added to the server 900 by inserting them into the racks of the assembly. The server 900 may also include a floppy disc drive, compact disc (CD) or digital versatile disc (DVD) disc drive 906 coupled to the processor 901. The server 900 may also include network access ports 903 coupled to the multicore processor assemblies 901 for establishing network interface connections with a network 905, such as a local area network coupled to other broadcast system computers and servers, the Internet, the public switched telephone network, and/or a cellular data network (e.g., CDMA, TDMA, GSM, PCS, 3G, 4G, LTE, 5G or any other type of cellular data network).

Figure 10A:
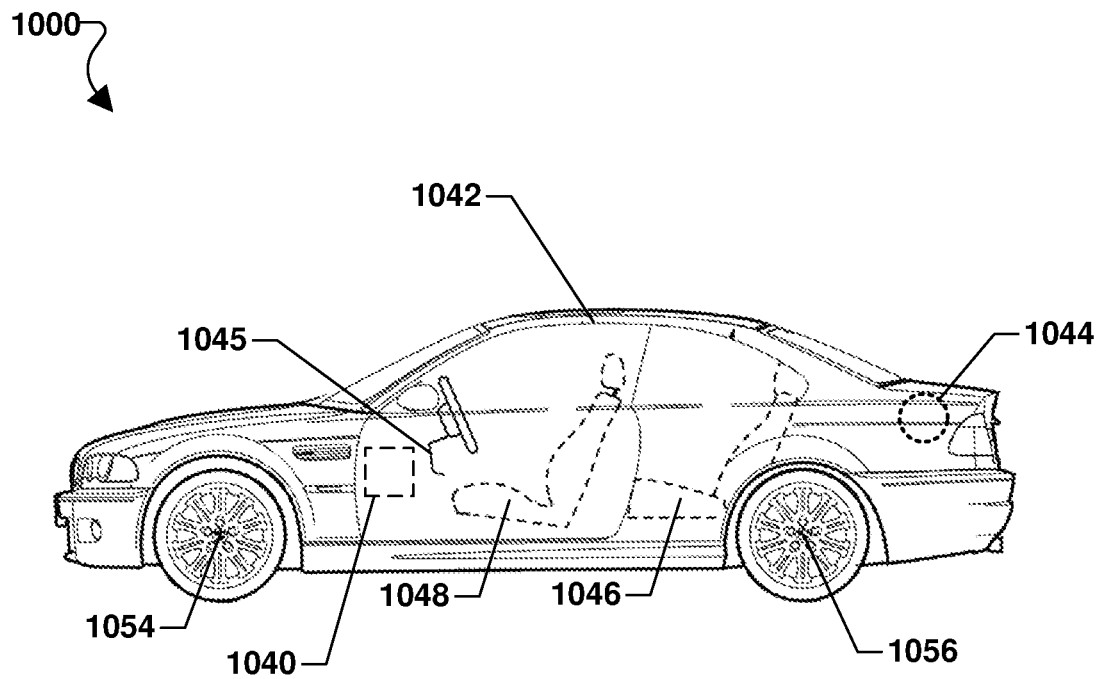
FIGS. 10A-10C are component block diagrams illustrating an example embedded vehicle computing system suitable for implementing various embodiments.
Figure 10B:
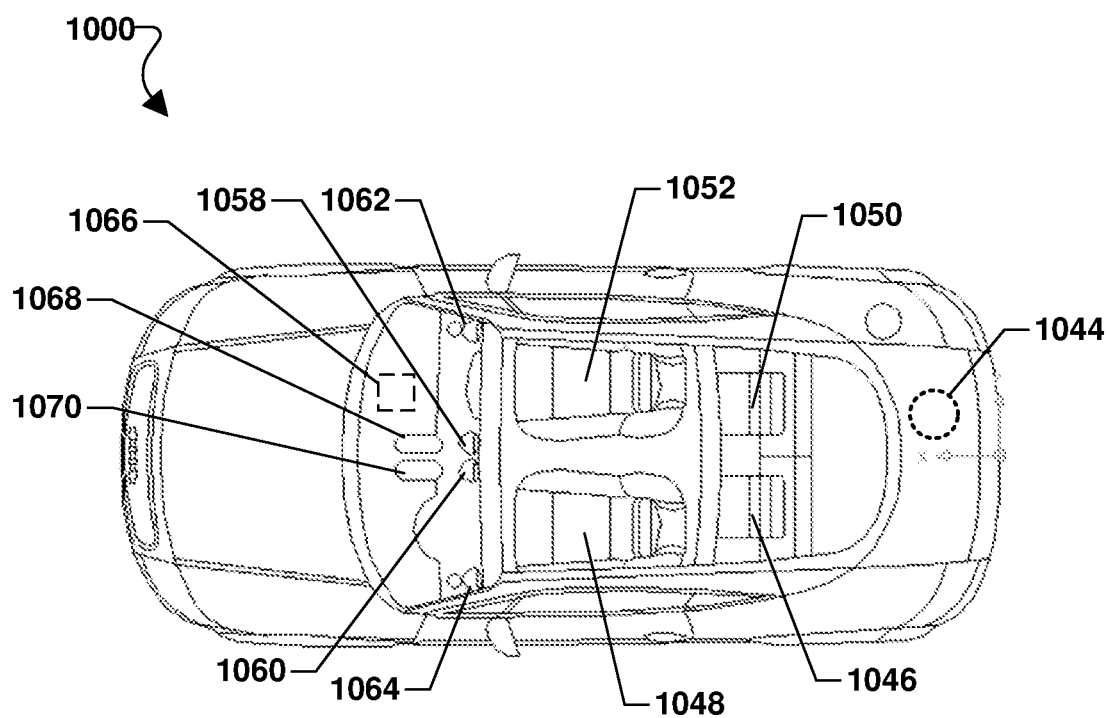
Figure 10C:
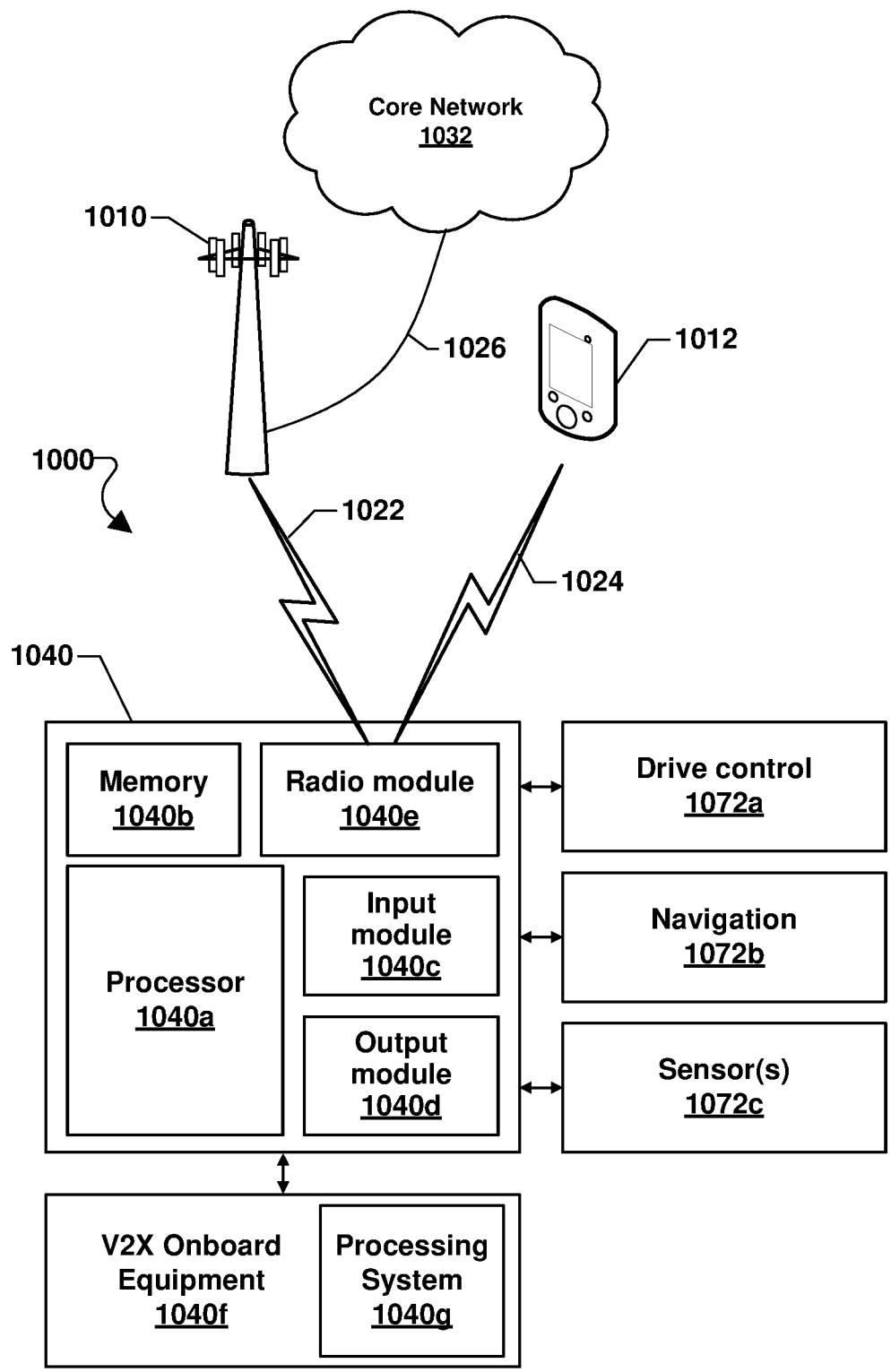

Methods and devices for implementing such methods in accordance with the various embodiments (including, but not limited to, embodiments described above with reference to FIGS. 1-6B) may be implemented in a wide variety of computing systems including an embedded vehicle computing system 1000 an example of which is illustrated in FIGS. 10A-10C. An embedded vehicle computing system 1000 may include a vehicle control unit 1040, such as an ECU, which may include a processor, such as a CPU, an AI processor, etc. The embedded vehicle computing system 1000 may include a plurality of sensors 1042-1070, including satellite GNSS receivers 1042, accelerometers 1044, occupancy sensors 1046, 1048, 1050, 1052, tire pressure sensors 1054, 1056, cameras 1058, 1060, microphones 1062, 1064, impact sensors 1066, external sensors 1068, 1070.

The plurality of sensors 1042-1070, disposed in or on the vehicle, may be used for various purposes, such as navigation, crash avoidance, etc., as well to provide sensor data regarding objects and people in or on the vehicle. The sensors 1042-1070 may include one or more of a wide variety of sensors capable of detecting a variety of information useful for navigation and collision avoidance. Each of the sensors 1042-1070 may be in wired or wireless communication with a control unit 1040, as well as with each other. In particular, the sensors may include one or more cameras 1058, 1060 or other optical sensors or photo optic sensors. The sensors may further include other types of object detection and ranging sensors, such as external sensors 1068, 1070, IR sensors, and ultrasonic sensors. The sensors may further include tire pressure sensors 1054, 1056, humidity sensors, temperature sensors, satellite GNSS receivers 1042, control input sensors 1045, accelerometers 1044, vibration sensors, gyroscopes, gravimeters, impact sensors 1066, force meters, stress meters, strain sensors, fluid sensors, chemical sensors, gas content analyzers, pH sensors, radiation sensors, Geiger counters, neutron detectors, biological material sensors, microphones 1062, 1064, occupancy sensors 1046, 1048, 1050, 1052, proximity sensors, and other sensors.

The vehicle control unit 1040 may include one or more processors configured with processor-executable instructions to perform navigation and collision avoidance operations using information received from various sensors, particularly the cameras 1058, 1060. In some embodiments, the control unit 1040 may supplement the processing of camera images using distance and relative position (e.g., relative bearing angle) that may be obtained from external sensors 1068, 1070. The control unit 1040 may further be configured to control steering, breaking and speed of the vehicle using information regarding other vehicles determined using various embodiments. The vehicle control unit 1040 may include one or more processors configured with processor-executable instructions to receive information from the sensors 1042-1070 and to perform operations using such information as further described herein. In various embodiments, the vehicle control unit 1040 may include, be a component of, or communicate with V2X onboard equipment of the vehicle.

FIG. 10C is a component block diagram illustrating the embedded vehicle computing system 1000 including components and support systems suitable for implementing various embodiments. The embedded vehicle computing system 1000 may include the control unit 1040, which may include various circuits and devices used to control the operation of the vehicle. The control unit 1040 may include a processor 1040*a*, such as a CPU, an AI processor, etc., a memory 1040*b*, an input module 1040*c*, an output module 1040*d*, and a radio module 1040*e*. The control unit 1040 may be coupled to and configured to control drive control components 1072*a*, navigation components 1072*b*, and one or more sensors 1072*c* of the embedded vehicle computing system 1000. The control unit 1040 may communicate with V2X onboard equipment 1040*f*. The processor 1040*a* may be configured with processor-executable instructions to control maneuvering, navigation, and/or other operations of the vehicle, including operations of various embodiments, including gathering and analyzing real-world vehicle run data gathered from the sensors 1072*c*. The processor 1040*a* may be coupled to the memory 1040*b*. The V2X onboard equipment 1040*f* may include one or more processors 1040*g* configured with processor-executable instructions to perform various operations of various embodiments, including communicating real-world vehicle run data gathered from the sensors 1072*c* between the embedded vehicle computing system 1040 and a wireless communication device 1012 and/or the computing device on a communication network (e.g., a core network 1032) via the radio module 1040*e*.

The radio module 1040*e* may be configured for wireless communication. The radio module 1040*e* may exchange signals (e.g., command signals for controlling maneuvering, signals from navigation facilities, data signals, etc.) via a communication link 1022 with a network transceiver (e.g., the base station 1010), and may provide the signals to the processor 1040*a*, 1040*g* and/or the navigation unit 1072*b*. In some embodiments, the radio module 1040*e* may enable the embedded vehicle computing system 1000 to communicate with a wireless communication device 1012 through the wireless communication link 1024. The wireless communication link 1024 may be a bidirectional or unidirectional communication link, and may use one or more communication protocols.

The input module 1040*c* may receive sensor data from one or more vehicle sensors 1072*c* as well as electronic signals from other components, including the drive control components 1072*a* and the navigation components 1072*b*. The output module 1040*d* may communicate with or activate various components of the embedded vehicle computing system 1000, including the drive control components 1072*a*, the navigation components 1072*b*, and the sensor(s) 1072*c*.

The control unit 1040 may be coupled to the drive control components 1072*a* to control physical elements of the vehicle related to maneuvering and navigation of the vehicle, such as the engine, motors, throttles, steering elements, flight control elements, braking or deceleration elements, and the like. The drive control components 1072*a* may also include components that control other devices of the vehicle, including interior environment controls (e.g., air conditioning and heating), external and/or interior lighting, interior and/or exterior informational displays (which may include a display screen or other devices to display information), safety devices (e.g., haptic devices, audible alarms, etc.), and other similar devices.

The control unit 1040 may be coupled to the navigation components 1072*b*, and may receive data from the navigation components 1072*b* and be configured to use such data to determine the present position and orientation of the vehicle, as well as an appropriate course toward a destination. The navigation components 1072*b* may include or be coupled to a GNSS receiver system (e.g., one or more Global Positioning System (GPS) receivers) enabling the embedded vehicle computing system 1000 to determine its current position using GNSS signals. Alternatively, or in addition, the navigation components 1072*b* may include radio navigation receivers for receiving navigation beacons or other signals from radio nodes, such as Wi-Fi access points, cellular network sites, radio station, remote computing devices, other vehicles, etc. Through control of the drive control elements 1072*a*, the processor 1040*a* may control the vehicle to navigate and maneuver. The processor 1040*a*, 1040*g* and/or the navigation components 1072*b* may be configured to communicate with a network element such as a server in a communication network (e.g., a core network 1032) via the wireless communication link 1022, 1026 to receive commands to control maneuvering, receive data useful in navigation, provide real-time position reports, etc.

The control unit 1040 may be coupled to one or more sensors 1072c. The sensor(s) 1072c may include the sensors 1042-1070 as described, and may the configured to provide a variety of data to the processor 1040a, 1040g.

While the control unit 1040 is described as including separate components, in some embodiments some or all of the components (e.g., the processor 1040a, the memory 1040b, the input module 1040c, the output module 1040d, and the radio module 1040e) may be integrated in a single device or module, such as an SoC processing device. Such an SoC processing device may be configured for use in vehicles and be configured, such as with processor-executable instructions executing in the processor 1040a, to perform operations of navigation and collision avoidance.

Implementation examples are described in the following paragraphs. While some of the following implementation examples are described in terms of example systems, devices, or methods, further example implementations may include: the example systems or devices discussed in the following paragraphs implemented as a method executing operations of the example systems or devices, the example systems, devices, or methods discussed in the following paragraphs implemented by a computing device comprising a processing device and/or a memory frequency device configured with processing device-executable instructions to perform operations of the example systems, devices, or methods; a memory frequency device configured to perform operations of the example systems, devices, or methods; a computing device comprising a configured to perform operations of the example systems, devices, or methods; the example systems, devices, or methods discussed in the following paragraphs implemented by a computing device including means for performing functions of the example systems, devices, or methods; and the example systems, devices, or methods discussed in the following paragraphs implemented as a non-transitory processor-readable storage medium having stored thereon processor-executable instructions configured to cause a processor of a computing device to perform the operations of the example systems, devices, or methods.

Example 1. A method for scaling memory frequency configuration of a memory of a computing device, including: comparing at least a memory refresh rate, a memory size, at least one use case bandwidth of transmission between the memory and a system on chip (SoC), and a use case latency of transmission between the memory and the SoC with at least one stored memory refresh rate, at least one stored memory size, at least one stored use case bandwidth of transmission between the memory and the SoC, and at least one stored use case latency of transmission between the memory and the SoC; selecting a memory frequency based on a result of the comparison; and configuring the memory for the memory frequency.

Example 2. The method of example 1, in which: the at least one use case bandwidth includes a use case current bandwidth and a use case average bandwidth; and the at least one stored use case bandwidth includes a stored use case current bandwidth and a stored use case average bandwidth.

Example 3. The method of any of examples 1 or 2, further including: identifying a stored memory refresh rate matching the memory refresh rate; identifying a stored memory size matching the memory size; identifying the at least one stored use case bandwidth matching the at least one use case bandwidth; identifying the at least one stored use case latency matching the use case latency, in which the result of the comparison includes the stored memory refresh rate, the stored memory size, the at least one stored use case bandwidth, and the at least one stored use case latency; and identifying the memory frequency stored in association with the stored memory refresh rate, the stored memory size, the at least one stored use case bandwidth, and the at least one stored use case latency.

Example 4. The method of any of examples 1-3, further including identifying a maximum memory frequency as the memory frequency in response to failing to identify at least one of the at least one stored use case bandwidth matching the at least one use case bandwidth or the at least one stored use case latency matching the use case latency, in which the result of the comparison includes less than all of the at least one stored use case bandwidth matching the use case bandwidth or the at least one stored use case latency matching the use case latency.

Example 5. The method of any of examples 1-4, further including issuing an alarm signal configured to indicate changing the use case for the memory to be able to achieve a use case parameter.

Example 6. The method of any of examples 1-5, further including receiving the memory refresh rate from a memory subsystem.

Example 7. The method of any of examples 1-6, further including transmitting a memory frequency modification signal to a memory subsystem.

Computer program code or "program code" for execution on a programmable processor for carrying out operations of the various embodiments may be written in a high level programming language such as C, C++, C#, Smalltalk, Java, JavaScript, Visual Basic, a Structured Query Language (e.g., Transact-SQL), Perl, or in various other programming languages. Program code or programs stored on a computer readable storage medium as used in this application may refer to machine language code (such as object code) whose format is understandable by a processor.

The foregoing method descriptions and the process flow diagrams are provided merely as illustrative examples and are not intended to require or imply that the operations of the various embodiments must be performed in the order presented. As will be appreciated by one of skill in the art the order of operations in the foregoing embodiments may be performed in any order. Words such as "thereafter," "then," "next," etc. are not intended to limit the order of the operations; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm operations described in connection with the various embodiments may be implemented as electronic hardware, computer software, or combinations of both. To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the claims.

The hardware used to implement the various illustrative logics, logical blocks, modules, and circuits described in connection with the embodiments disclosed herein may be implemented or performed with a general purpose processor, a digital signal processor (DSP), an application-specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more embodiments, the functions described may be implemented in hardware, software, firmware, or any combination thereof. If implemented in software, the functions may be stored as one or more instructions or code on a non-transitory computer-readable medium or a non-transitory processor-readable medium. The operations of a method or algorithm disclosed herein may be embodied in a processor-executable software module that may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed embodiments is provided to enable any person skilled in the art to make or use the claims. Various modifications to these embodiments will be readily apparent to those skilled in the art, and the generic principles defined herein may be applied to other embodiments and implementations without departing from the scope of the claims. Thus, the present disclosure is not intended to be limited to the embodiments and implementations described herein, but is to be accorded the widest scope consistent with the following claims and the principles and novel features disclosed herein.

What is claimed is:

1. A method for scaling memory frequency configuration of a memory of a computing device, comprising:
   obtaining a set of real-time use case parameters for a use case while the use case is executed by the computing device, wherein the set of real-time use case parameters includes
   at least a memory refresh rate of the memory,
   a memory size of the memory,
   at least one use case bandwidth of transmission between the memory and a system on chip (SoC), and
   a use case latency of transmission between the memory and the SoC;
   comparing the set of real-time use case parameters with a stored set of use case parameters, wherein the stored set of use case parameters include
   at least one stored memory refresh rate,
   at least one stored memory size,
   at least one stored use case bandwidth of transmission between the memory and the SoC, and
   at least one stored use case latency of transmission between the memory and the SoC;
   selecting a memory frequency based on a result of the comparison; and
   configuring the memory to operate at the memory frequency for the execution of the use case by the computing device.

2. The method of claim 1, wherein:
   the at least one use case bandwidth comprises a use case current bandwidth and a use case average bandwidth; and
   the at least one stored use case bandwidth comprises a stored use case current bandwidth and a stored use case average bandwidth.

3. The method of claim 1, further comprising:
   identifying a stored memory refresh rate matching the memory refresh rate;
   identifying a stored memory size matching the memory size;
   identifying the at least one stored use case bandwidth matching the at least one use case bandwidth;
   identifying the at least one stored use case latency matching the use case latency, wherein the result of the comparison comprises the stored memory refresh rate, the stored memory size, the at least one stored use case bandwidth, and the at least one stored use case latency; and
   identifying the memory frequency stored in association with the stored memory refresh rate, the stored memory size, the at least one stored use case bandwidth, and the at least one stored use case latency.

4. The method of claim 1, further comprising identifying a maximum memory frequency as the memory frequency in response to failing to identify at least one of the at least one stored use case bandwidth matching the at least one use case bandwidth or the at least one stored use case latency matching the use case latency, wherein the result of the comparison comprises less than all of the at least one stored use case bandwidth matching the use case bandwidth or the at least one stored use case latency matching the use case latency.

5. The method of claim 1, further comprising issuing an alarm signal configured to indicate changing the use case for the memory to be able to achieve a use case parameter.

6. The method of claim 1, further comprising receiving the memory refresh rate from a memory sub-system.

7. The method of claim 1, further comprising transmitting a memory frequency modification signal to a memory sub-system.

8. A computing device, comprising:
   a memory frequency device configured to:
   obtain a set of real-time use case parameters for a use case while the use case is executed by the computing device, wherein the set of real-time use case parameters includes at least a memory refresh rate of the memory,
a memory size of the memory,
at least one use case bandwidth of transmission between the memory and a system on chip (SoC), and
a use case latency of transmission between the memory and the SoC;
compare the set of real-time use case parameters with a stored set of use case parameters, wherein the stored set of use case parameters include
at least one stored memory refresh rate,
at least one stored memory size,
at least one stored use case bandwidth of transmission between the memory and the SoC, and
at least one stored use case latency of transmission between the memory and the SoC;
select a memory frequency based on a result of the comparison; and
configure the memory to operate at the memory frequency for the execution of the use case by the computing device.

9. The computing device of claim 8, wherein the memory frequency device is configured such that:
the at least one use case bandwidth comprises a use case current bandwidth and a use case average bandwidth; and
the at least one stored use case bandwidth comprises a stored use case current bandwidth and a stored use case average bandwidth.

10. The computing device of claim 8, wherein the memory frequency device is further configured to:
identify a stored memory refresh rate matching the memory refresh rate;
identify a stored memory size matching the memory size;
identify the at least one stored use case bandwidth matching the at least one use case bandwidth;
identify the at least one stored use case latency matching the use case latency, wherein the result of the comparison comprises the stored memory refresh rate, the stored memory size, the at least one stored use case bandwidth, and the at least one stored use case latency; and
identify the memory frequency stored in association with the stored memory refresh rate, the stored memory size, the at least one stored use case bandwidth, and the at least one stored use case latency.

11. The computing device of claim 8, wherein the memory frequency device is further configured to identify a maximum memory frequency as the memory frequency in response to failing to identify at least one of the at least one stored use case bandwidth matching the at least one use case bandwidth or the at least one stored use case latency matching the use case latency, wherein the result of the comparison comprises less than all of the at least one stored use case bandwidth matching the use case bandwidth or the at least one stored use case latency matching the use case latency.

12. The computing device of claim 8, wherein the memory frequency device is further configured to issue an alarm signal configured to indicate changing the use case for the memory to be able to achieve a use case parameter.

13. The computing device of claim 8, wherein the memory frequency device is further configured to receive the memory refresh rate from a memory sub-system.

14. The computing device of claim 8, wherein the memory frequency device is further configured to transmit a memory frequency modification signal to a memory sub-system.

15. A computing device, comprising:
means for obtaining a set of real-time use case parameters for a use case while the use case is executed by the computing device, wherein the set of real-time use case parameters includes
at least a memory refresh rate of the memory,
a memory size of the memory,
at least one use case bandwidth of transmission between the memory and a system on chip (SoC), and
a use case latency of transmission between the memory and the SoC;
means for comparing the set of real-time use case parameters with a stored set of use case parameters, wherein the stored set of use case parameters include
at least one stored memory refresh rate,
at least one stored memory size,
at least one stored use case bandwidth of transmission between the memory and the SoC, and
at least one stored use case latency of transmission between the memory and the SoC;
means for selecting a memory frequency based on a result of the comparison; and
means for configuring the memory to operate at the memory frequency for the execution of the use case by the computing device.

16. The computing device of claim 15, wherein:
the at least one use case bandwidth comprises a use case current bandwidth and a use case average bandwidth; and
the at least one stored use case bandwidth comprises a stored use case current bandwidth and a stored use case average bandwidth.

17. The computing device of claim 15, further comprising:
means for identifying a stored memory refresh rate matching the memory refresh rate;
means for identifying a stored memory size matching the memory size;
means for identifying the at least one stored use case bandwidth matching the at least one use case bandwidth;
means for identifying the at least one stored use case latency matching the use case latency, wherein the result of the comparison comprises the stored memory refresh rate, the stored memory size, the at least one stored use case bandwidth, and the at least one stored use case latency; and
means for identifying the memory frequency stored in association with the stored memory refresh rate, the stored memory size, the at least one stored use case bandwidth, and the at least one stored use case latency.

18. The computing device of claim 15, further comprising means for identifying a maximum memory frequency as the memory frequency in response to failing to identify at least one of the at least one stored use case bandwidth matching the at least one use case bandwidth or the at least one stored use case latency matching the use case latency, wherein the result of the comparison comprises less than all of the at least one stored use case bandwidth matching the use case bandwidth or the at least one stored use case latency matching the use case latency.

19. The computing device of claim 15, further comprising means for issuing an alarm signal configured to indicate changing the use case for the memory to be able to achieve a use case parameter.

20. The computing device of claim 15, further comprising means for receiving the memory refresh rate from a memory sub-system.

21. The computing device of claim 15, further comprising means for transmitting a memory frequency modification signal to a memory sub-system.

22. A non-transitory processor-readable medium having stored thereon processor executable instructions configured to cause a memory frequency device of a computing device to perform operations comprising:
    obtaining a set of real-time use case parameters for a use case while the use case is executed by the computing device, wherein the set of real-time use case parameters includes
        at least a memory refresh rate of the memory,
        a memory size of the memory,
        at least one use case bandwidth of transmission between the memory and a system on chip (SoC), and
        a use case latency of transmission between the memory and the SoC;
    comparing the set of real-time use case parameters with a stored set of use case parameters, wherein the stored set of use case parameters include
        at least one stored memory refresh rate,
        at least one stored memory size,
        at least one stored use case bandwidth of transmission between the memory and the SoC, and
        at least one stored use case latency of transmission between the memory and the SoC;
    selecting a memory frequency based on a result of the comparison; and
    configuring the memory to operate at the memory frequency for execution of the use case by the computing device.

23. The non-transitory processor-readable medium of claim 22, wherein:
    the at least one use case bandwidth comprises a use case current bandwidth and a use case average bandwidth; and
    the at least one stored use case bandwidth comprises a stored use case current bandwidth and a stored use case average bandwidth.

24. The non-transitory processor-readable medium of claim 22, wherein the stored processor executable instructions are configured to cause the memory frequency device to perform operations further comprising:
    identifying a stored memory refresh rate matching the memory refresh rate;
    identifying a stored memory size matching the memory size;
    identifying the at least one stored use case bandwidth matching the at least one use case bandwidth;
    identifying the at least one stored use case latency matching the use case latency, wherein the result of the comparison comprises the stored memory refresh rate, the stored memory size, the at least one stored use case bandwidth, and the at least one stored use case latency; and
    identifying the memory frequency stored in association with the stored memory refresh rate, the stored memory size, the at least one stored use case bandwidth, and the at least one stored use case latency.

25. The non-transitory processor-readable medium of claim 22, wherein the stored processor executable instructions are configured to cause the memory frequency device to perform operations further comprising identifying a maximum memory frequency as the memory frequency in response to failing to identify at least one of the at least one stored use case bandwidth matching the at least one use case bandwidth or the at least one stored use case latency matching the use case latency, wherein the result of the comparison comprises less than all of the at least one stored use case bandwidth matching the use case bandwidth or the at least one stored use case latency matching the use case latency.

26. The non-transitory processor-readable medium of claim 22, wherein the stored processor executable instructions are configured to cause the memory frequency device to perform operations further comprising issuing an alarm signal configured to indicate changing the use case for the memory to be able to achieve a use case parameter.

27. The non-transitory processor-readable medium of claim 22, wherein the stored processor executable instructions are configured to cause the memory frequency device to perform operations further comprising receiving the memory refresh rate from a memory sub-system.

28. The non-transitory processor-readable medium of claim 22, wherein the stored processor executable instructions are configured to cause the memory frequency device to perform operations further comprising transmitting a memory frequency modification signal to a memory sub-system.

* * * * *